US012615918B2

(12) United States Patent
Chen et al.

(10) Patent No.: US 12,615,918 B2
(45) Date of Patent: Apr. 28, 2026

(54) DISPLAY DEVICE AND METHOD OF FABRICATING THE SAME

(71) Applicants: TAIWAN SEMICONDUCTOR MANUFACTURING CO., LTD., Hsinchu (TW); TSMC CHINA COMPANY LIMITED, Shanghai (CN)

(72) Inventors: Shui-Liang Chen, Shanghai City (CN); Lin-Chun Gui, Shanghai City (CN); Jian Huang, Shanghai City (CN); Lin-Lin Tian, Shanghai City (CN)

(73) Assignees: TAIWAN SEMICONDUCTOR MANUFACTURING COMPANY, LTD., Hsinchu (TW); TSMC CHINA COMPANY, LIMITED, Shanghai (CN)

( * ) Notice: Subject to any disclaimer, the term of this patent is extended or adjusted under 35 U.S.C. 154(b) by 209 days.

(21) Appl. No.: 16/937,367

(22) Filed: Jul. 23, 2020

(65) Prior Publication Data

US 2021/0091329 A1 Mar. 25, 2021

(30) Foreign Application Priority Data

Sep. 23, 2019 (CN) .......................... 201910899516.7

(51) Int. Cl.
  *H10K 59/122* (2023.01)
  *G02B 27/01* (2006.01)
  (Continued)

(52) U.S. Cl.
  CPC ....... *H10K 59/122* (2023.02); *G02B 27/0172* (2013.01); *H10K 50/131* (2023.02);
  (Continued)

(58) Field of Classification Search
  CPC ............. H01L 51/5209; H01L 51/5218; H01L 51/5225; H01L 51/5044; H01L 51/56;
  (Continued)

(56) References Cited

U.S. PATENT DOCUMENTS 6,727,871 B1 4/2004 Suzuki et al.
2001/0030322 A1 10/2001 Yamazaki et al.
(Continued)

FOREIGN PATENT DOCUMENTS

CN 104952906 A 9/2015
CN 107885004 A 4/2018
(Continued)

*Primary Examiner* — Sue A Purvis
*Assistant Examiner* — Aneta B Cieslewicz
(74) *Attorney, Agent, or Firm* — Hauptman Ham, LLP

(57) ABSTRACT

An organic light emitting diode display includes an integrated circuit, a first electrode, a spacer, an organic material stack layer, and a second electrode. The first electrode is electrically connected to the integrated circuit and has a top surface, a bottom surface, and an inclined surface connecting the top and bottom surfaces. An angle between the inclined surface and the bottom surface is in a range from about 45 degrees to about 80 degrees. The spacer is disposed to cover the inclined surface of the first electrode. The organic material stack layer is disposed on the first electrode. The second electrode is disposed on the organic material stack layer and the spacers.

20 Claims, 21 Drawing Sheets

(51) Int. Cl.

| | |
|---|---|
| *H10K 50/13* | (2023.01) |
| *H10K 59/12* | (2023.01) |
| *H10K 59/123* | (2023.01) |
| *H10K 59/124* | (2023.01) |
| *H10K 59/50* | (2023.01) |
| *H10K 59/80* | (2023.01) |
| *H10K 71/20* | (2023.01) |

(52) U.S. Cl.

CPC ....... *H10K 59/1201* (2023.02); *H10K 59/124* (2023.02); *H10K 59/50* (2023.02); *H10K 59/80515* (2023.02); *H10K 59/80518* (2023.02); *H10K 71/231* (2023.02); *G02B 2027/0178* (2013.01); *H10K 59/123* (2023.02)

(58) Field of Classification Search

CPC ............. H01L 51/0017; H01L 27/3246; H01L 27/3258; H01L 27/3232; H01L 27/3244; H01L 2227/323; H01L 2227/326; H10K 50/813; H10K 50/818; H10K 50/822; H10K 50/131; H10K 59/80515; H10K 59/80518; H10K 59/122; H10K 59/123; H10K 59/124; H10K 59/50; H10K 59/12; H10K 59/131; H10K 59/1315; H10K 59/1201; H10K 71/00; H10K 71/40; H10K 71/421; H10K 71/441; H10K 71/231; G02F 1/1333; G02F 1/1343; G02B 27/0172; G02B 2027/0178

See application file for complete search history.

(56) References Cited

U.S. PATENT DOCUMENTS

| | | | | |
|---|---|---|---|---|
| 2003/0197466 A1* | 10/2003 | Yamazaki | ........... | H01L 27/3246 313/504 |
| 2004/0155575 A1 | 8/2004 | Suzuki et al. | | |
| 2005/0001963 A1* | 1/2005 | Yokoyama | ........... | H01L 51/5234 349/122 |
| 2005/0285100 A1* | 12/2005 | Jeong | ................ | H01L 51/5209 438/149 |
| 2005/0285512 A1 | 12/2005 | Murayama | | |
| 2006/0060838 A1 | 3/2006 | Kang et al. | | |
| 2006/0086692 A1* | 4/2006 | Fujimoto | ................ | C23F 4/00 216/96 |
| 2006/0145159 A1* | 7/2006 | Yokoyama | ........... | H10K 50/818 257/E33.064 |
| 2008/0067932 A1 | 3/2008 | Baek et al. | | |
| 2008/0083611 A1 | 4/2008 | Felmetsger | | |
| 2009/0309858 A1 | 12/2009 | Jin et al. | | |
| 2010/0019231 A1 | 1/2010 | Smith et al. | | |
| 2011/0177640 A1 | 7/2011 | Han et al. | | |
| 2013/0187163 A1* | 7/2013 | Kim | ................... | H10K 59/122 438/34 |
| 2015/0060832 A1 | 3/2015 | Ito et al. | | |
| 2016/0041659 A1 | 2/2016 | Chen et al. | | |
| 2016/0240819 A1* | 8/2016 | Choi | ................... | H10K 59/879 |
| 2016/0254488 A1 | 9/2016 | Hakii et al. | | |
| 2018/0123081 A1* | 5/2018 | Baik | ................... | H10K 59/122 |
| 2019/0043934 A1* | 2/2019 | Ukigaya | ........... | G09G 3/3233 |
| 2019/0058022 A1 | 2/2019 | Baik et al. | | |
| 2019/0157613 A1* | 5/2019 | Lee | ........................ | H01L 51/56 |
| 2019/0189729 A1 | 6/2019 | Zhang et al. | | |
| 2020/0016879 A1 | 1/2020 | Gotrik et al. | | |
| 2020/0035779 A1* | 1/2020 | Huang | ............. | H01L 21/31116 |
| 2020/0168684 A1 | 5/2020 | Kim et al. | | |
| 2021/0057504 A1 | 2/2021 | Ko et al. | | |
| 2022/0013593 A1 | 1/2022 | Watanabe et al. | | |

FOREIGN PATENT DOCUMENTS

| | | | | | |
|---|---|---|---|---|---|
| JP | 2001110575 A | 4/2001 | | | |
| JP | 2002015860 A | 1/2002 | | | |
| JP | 2003249377 A | 9/2003 | | | |
| JP | 2006012585 A | 1/2006 | | | |
| JP | 2010503192 A | 1/2010 | | | |
| JP | 2011091279 A | 5/2011 | | | |
| JP | 2012255960 A | 12/2012 | | | |
| JP | 2013101352 A | 5/2013 | | | |
| JP | 2015053137 A | 3/2015 | | | |
| KR | 20010050817 A | 6/2001 | | | |
| KR | 20060060461 A | 6/2006 | | | |
| KR | 20100043943 A | 4/2010 | | | |
| KR | 101536194 B1 | 7/2015 | | | |
| KR | 20180086410 A | 7/2018 | | | |
| TW | 200713409 A | 4/2007 | | | |
| TW | 201606607 A | 2/2016 | | | |
| TW | I576626 B | 4/2017 | | | |
| TW | 201810761 A | 3/2018 | | | |
| WO | WO-2014155691 A1 * | 10/2014 | ........ | H01L 27/3246 | |
| WO | 2019080255 A1 | 5/2019 | | | |

* cited by examiner

142

142

142

S10

110

S30

S50

S60

S70

S90 imaging screen — 230

220

LCOS display panel — 226 optical unit — 224 light source — 222

DISPLAY DEVICE AND METHOD OF FABRICATING THE SAME

PRIORITY CLAIM AND CROSS-REFERENCE

The present application claims priority to China Application Serial Number 201910899516.7, filed Sep. 23, 2019, which is herein incorporated by reference.

BACKGROUND

Along with the development of technology applied to virtual reality (VR) and augmented reality (AR), head gear devices have become more popular. However, improvements can be made to current yield of fabrication applied to scaled down head gear devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
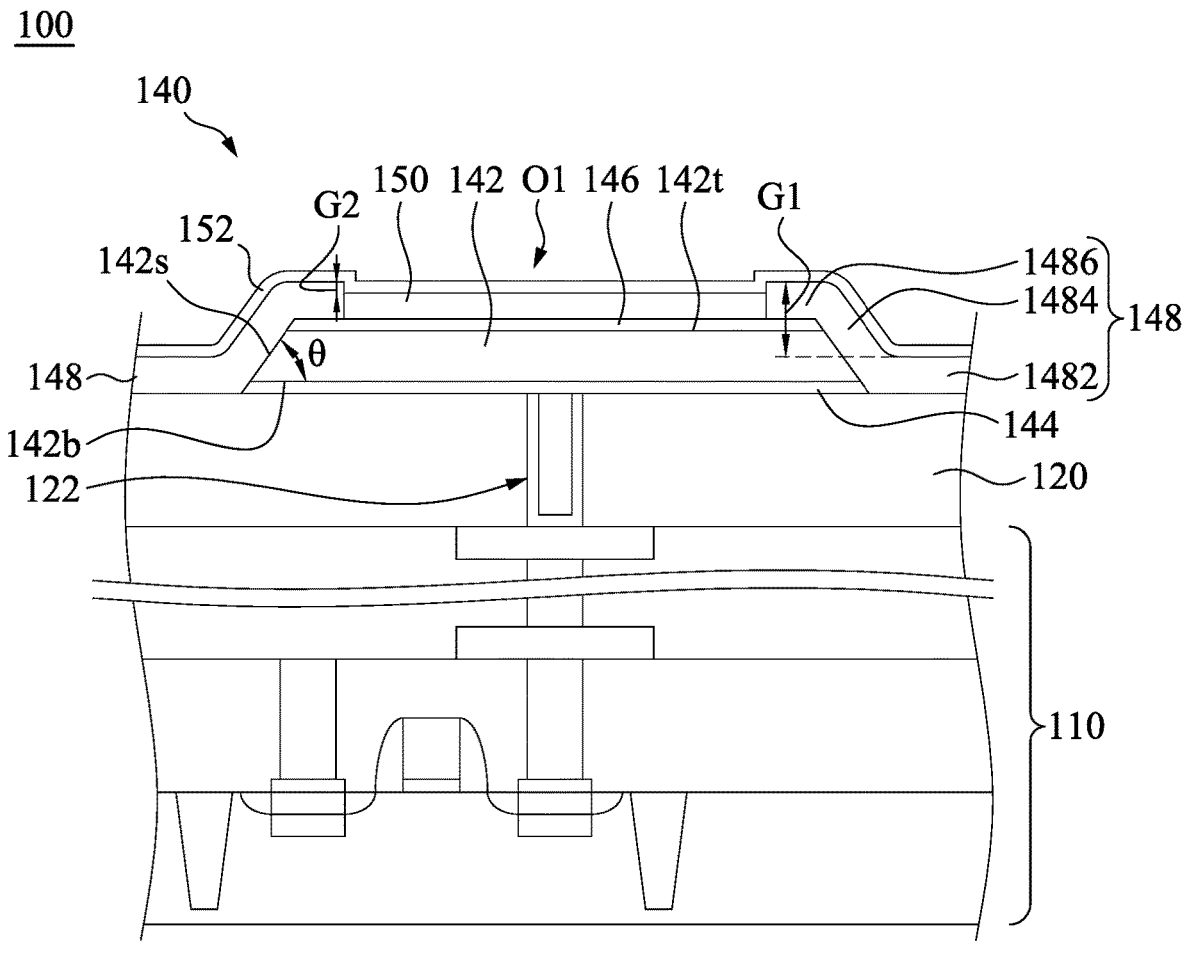
FIG. 1 shows a cross-sectional view of an organic light emitting diode display device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a cross-sectional view of an organic light emitting diode display device according to some embodiments of the present disclosure. The organic light emitting diode display device 100 includes an integrated circuit 110, an insulation layer 120 disposed on the integrated circuit 110, and a plurality of organic light-emitting units 140 (the figure shows only one for ease of description) disposed on the insulation layer 120. Each of the organic light emitting diode units 140 is electrically connected to the integrated circuit 110 thereunder through a respective via plug 122 in the insulation layer 120. In some embodiments of the present disclosure, the integrated circuit 110 and the insulation layer 120 there-above serve as a base for disposing the organic light emitting diode units 140.

In some embodiments of the present disclosure, the organic light emitting diode units 140 and the integrated circuit 110 are both fabricated by a semiconductor process for scaling down the organic light emitting diode display device. In other embodiments, the organic light emitting diode display device 100 can be further attached to other carrier panels. In some embodiments of the present disclosure, the organic light emitting diode units 140 are micro organic light emitting diodes.

The organic light emitting diode unit 140 includes a first electrode 142, blocking layers 144 and 146, a spacer layer 148, an organic material stack layer 150, and a second electrode 152. The first electrode 142 is disposed on the insulation layer 120, and the second electrode 152 is arranged opposite to the first electrode 142. The organic material stack layer 150 is disposed between the first electrode 142 and the second electrode 152. The first electrode 142 can serve as an anode of the organic light emitting diode unit 140, and the second electrode 152 can serve as the cathode of the organic light emitting diode unit 140. The organic light emitting diode unit 140 emits light through the cathode. Therefore, the second electrode 152 can serve as the light emitting side of the organic light emitting diode unit 140.

Two opposite surfaces of the first electrode 142 are respectively arranged with the blocking layers 144, 146. Namely, the blocking layer 144 is disposed between the first electrode 142 and the insulation layer 120, and the blocking layer 146 is disposed on the surface of the first electrode 142 opposite the blocking layer 144. The blocking layer 144 serves to block material of the first electrode 142 from the insulation layer 120, such as blocking material from the first electrode 142 from diffusing into the insulation layer 120. The blocking layer 146 serves to block material of the first electrode 142 from the organic material stack layer 150 above the first electrode 142, so as to prevent material of the first electrode 142 from directly contacting the organic material stack layer 150 above the first electrode 142 and causing unexpected reactions. In some embodiments of the present disclosure, material of the blocking layers 144, 146 is a metal nitride, such as titanium nitride (TiN) or other similar material.

In some embodiments of the present disclosure, the spacer layer 148 is disposed on an outer side of the first electrode 142, such as covering an outermost sidewall of the first electrode 142, and on a top surface of the insulation layer 120. The spacer layer 148 separates the first electrodes 142 of neighboring organic light emitting diode units 140 from each other, and prevents the sidewall of the first electrodes 142, such as the sidewall of the first electrode 142 exposed from the blocking layers 144, 146, from directly contacting the organic material stack layer 150.

The organic material stack layer 150 is deposited on the first electrode 142. In some embodiments of the present disclosure, the spacer layer 148 has an opening region O1, and the organic material stack layer 150 is filled in the opening region O1. In some embodiments of the present disclosure, the organic material stack layers 150 of neighboring organic light emitting diode units 140 can be configured with different organic light emitting layers, so as to emit light of different colors. The organic material stack layers 150 of the neighboring organic light emitting diode units 140 can be spaced apart by the spacer layers 148, so as to prevent the organic material stack layers 150 of the different organic light emitting diode units 140 from directly contacting with each other. The second electrode 152 is a shared electrode, and extends continuously on top surfaces of the spacer layers 148 and the organic material stack layers 150.

In some embodiments of the present disclosure, the second electrode 152 is conformally disposed on the organic material stack layers 150 and the spacer layers 148. Namely, a thickness of the second electrode 152 is generally uniform. Given that the spacer layer 148 extends from the top surface of the insulation layer 120, along the sidewall of the first electrode 142, to a top surface of the blocking layer 146, a highest position and a lowest position of a top surface of the spacer layer 148 therefore has an vertical offset G1 therebetween. In order to maintain the translucency of the second electrode 152, the thickness of the second electrode 152 is usually very thin, and the second electrode 152 is therefore prone to being broken due to an excessively large offset G1. Some embodiments of the present disclosure reduces the vertical offset G1 between the highest position and the lowest position of the top surface of the spacer 148, thereby preventing the second electrode 152 from being broken due to excessively large offset G1.

In some embodiments of the present disclosure, a cross section of the first electrode 142 is not rectangular, and is wider at the bottom than at the top, such as a trapezoid that is wider at the bottom and narrow at the top. In other words, a top surface 142t of the first electrode 142 is substantially parallel to a bottom surface 142b of the first electrode 142, an area of the top surface 142t of the first electrode 142 is smaller than an area of the bottom surface 142b of the first electrode 142, and the top surface 142t of the first electrode 142 and the bottom surface 142b of the first electrode 142 are connected by an inclined surface 142s there-between, wherein the inclined surface 142s of the first electrode 142 is not covered by a blocking layer. An angle $\theta$ is included between the bottom surface 142b of the first electrode 142 and the inclined surface 142s of the first electrode 142.

Figure 2:
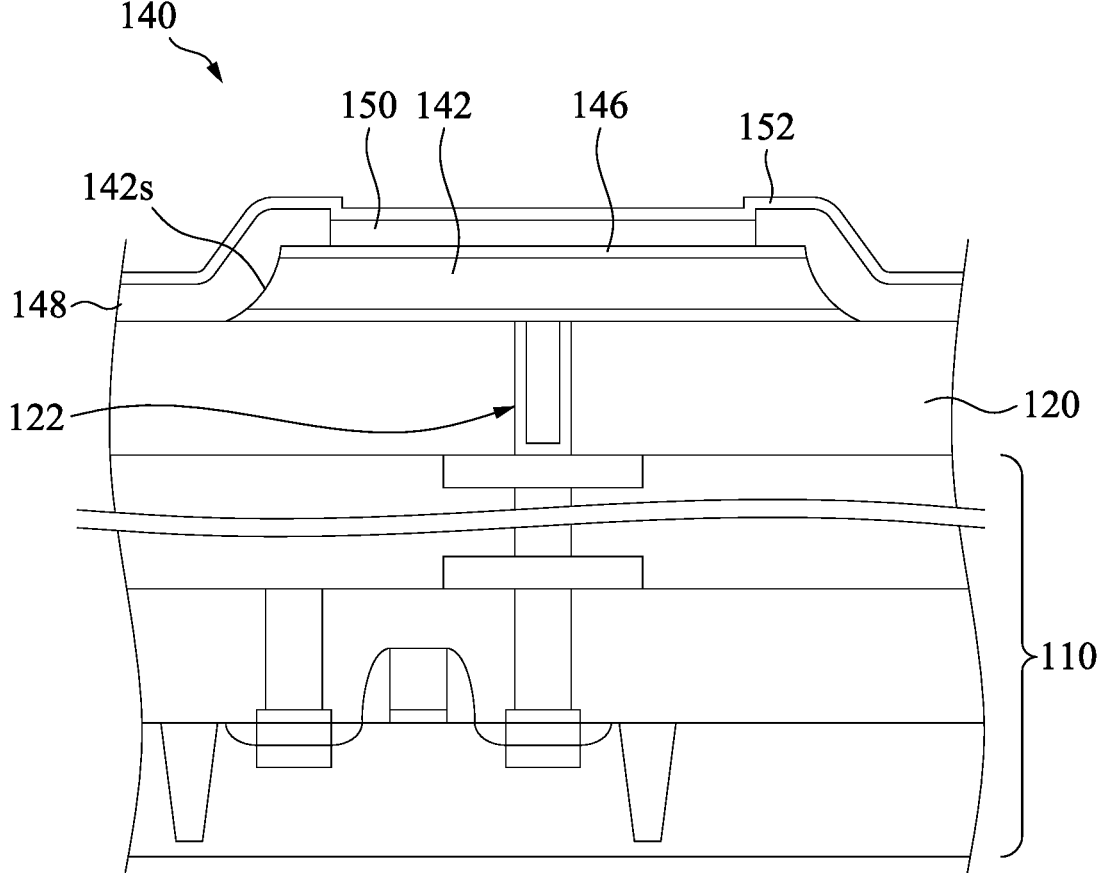
FIG. 2 and FIG. 3 each show a cross-sectional view of an organic light emitting diode display device according to some embodiments of the present disclosure.
Figure 3:
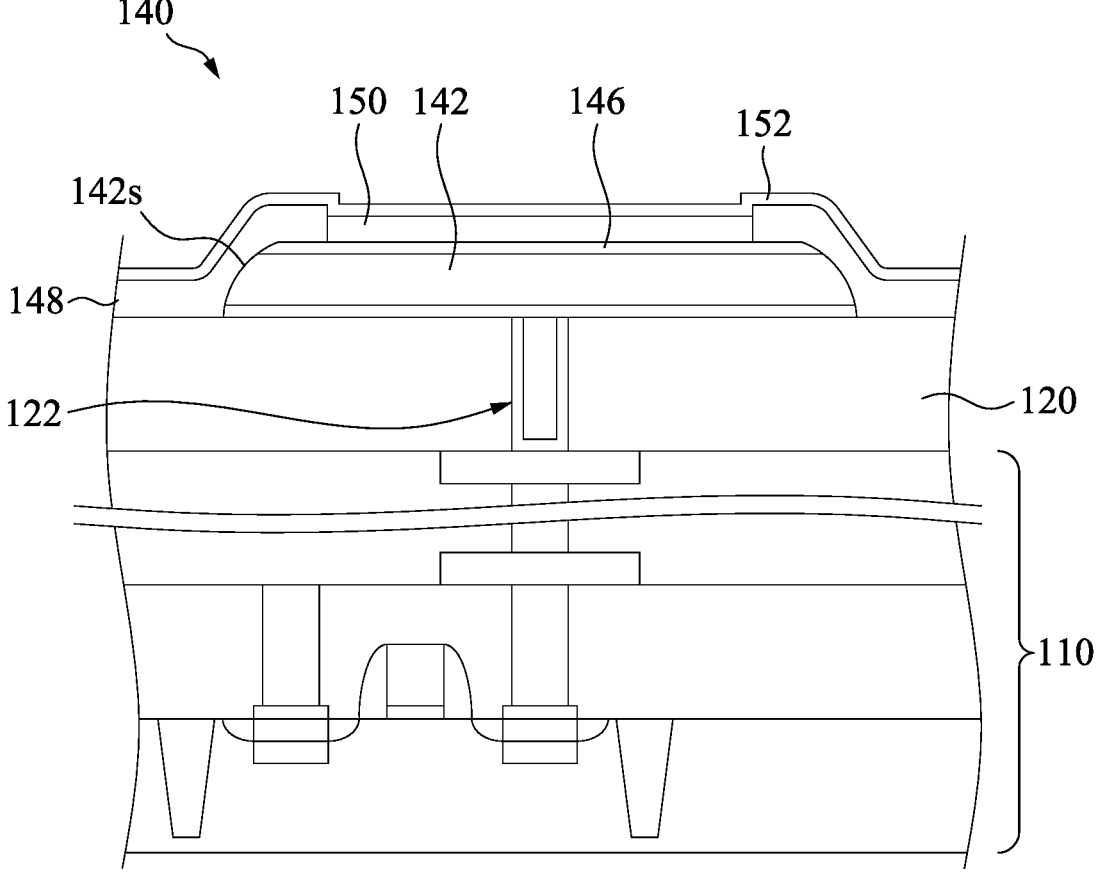

FIG. 2 and FIG. 3 each show a cross-sectional view of an organic light emitting diode display device according to some embodiments of the present disclosure. In some embodiments of the present disclosure, the inclined surface 142s of the first electrode is not necessarily flat, and can be a curved concave surface as shown in FIG. 2, or a curved convex surface as shown in FIG. 3.

Figure 4A:
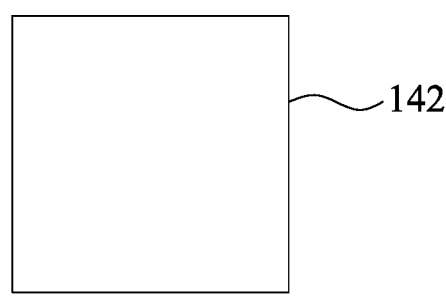
FIG. 4A to FIG. 4C each show a top view of a first electrode of an organic light emitting diode unit according to some embodiments of the present disclosure.
Figure 4B:
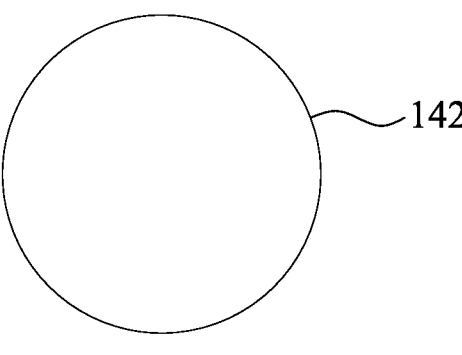
Figure 4C:
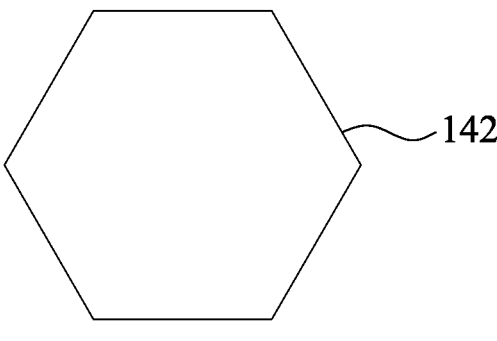

FIG. 4A to FIG. 4C each show a top view of a first electrode of an organic light emitting diode unit according to some embodiments of the present disclosure. In some embodiments of the present disclosure, a shape viewed from above of the first electrode 142 can be a rectangle as shown in FIG. 4A, a circle as shown in FIG. 4B, a hexagon as shown in FIG. 4C, or other suitable shapes.

Referring back to FIG. 1, in some embodiments of the present disclosure, in each of the organic light emitting diode units 140, the first electrode 142 has the inclined surface 142s, and the area of the top surface 142t of the first electrode 142 is less than the area of the bottom surface 142b of the first electrode, such that the inclined surface 142s of the first electrode 142 and the bottom surface 142b of the first electrode has the angle $\theta$ included there-between.

In some embodiments of the present disclosure, the angle $\theta$ included between the inclined surface 142s of the first electrode 142 and the bottom surface 142b of the first electrode 142 is in a range between about 45 degrees to about 80 degrees. If the included angle $\theta$ is greater than about 80 degrees, then the vertical offset G1 cannot be effectively reduced, and also results in a high turning angle of the spacer layer 148. For example, the spacer layer 148 includes a first section 1482, a second section 1484, and a third section 1486 that are sequentially connected. The first section 1482 of the spacer layer 148 is disposed on the insulation layer 120, and substantially extends along the top surface of the insulation layer 120. The third section 1486 of the spacer layer 148 covers a portion of the blocking layer 146, and substantially extends the top surface of the blocking layer 146. The second section 1484 of the spacer layer 148 substantially extends along the inclined surface 142s of the first electrode 142, and connects the first section 1482 of the spacer layer 148 and the third section 1486 of the spacer layer 148. The vertical offset G1 between the highest position and the lowest position of the top surface of the spacer layer 148 is the vertical distance between the top surface of the first section 1482 of the spacer layer 148 and the top surface of the third section 1486 of the spacer layer 148.

If the included angle $\theta$ between the inclined surface 142s of the first electrode 142 and the bottom surface 142b of the first electrode is greater than about 80 degrees, then the turning angle between the first section 1482 of the spacer layer 148 and the second section 1484 of the spacer layer 148, or the turning angle between the second section 1484 of the spacer layer 148 and the third section 1486 of the spacer lay 148, may be overly high, and results in a nearly perpendicular turning angle. Given that the second electrode 152 is conformally fabricated on the spacer layer 148, and that the thickness of the second electrode 152 is very thin, the second electrode 152 is therefore prone to being broken at locations of high turning angles. On the other hand, if the included angle $\theta$ between the inclined surface 142s of the first electrode 142 and the bottom surface 142b of the first electrode 142 is less than about 45 degrees, then a length of the second section 1484 of the spacer layer 148 is correspondingly increased such that the distance between the organic light emitting diode units 140 may be overly long and reduces the resolution of OLED display, or that the light emitting area of the organic light emitting diode unit 140 is reduced.

Additionally, if the angle θ included between the inclined surface 142s of the first electrode 142 and the bottom surface 142b of the first electrode 142 is greater than about 80 degrees, then the cross-sectional shape of the first electrode may be close a rectangle. If the thickness of the spacer layer 148 is not sufficient, then the step coverage of the spacer layer 148 on the first electrode 142 may be poor, resulting in peeling at a corner of the spacer layer 148, such as at the corner between the second section 1484 and the third section 1486 of the spacer layer 148, such that the organic material stack layer 150 fabricated subsequently may unwantedly flow into the peeling location of the spacer layer 148 and in turn contact the first electrode 142, resulting in unexpected reactions.

Additionally, when the angle θ included between the inclined surface 142s of the first electrode 142 and the bottom surface 142b of the first electrode 142 is about 80 degrees, if the spacer layer 148 is to adequately cover the inclined surface 142s of the first electrode 142, the thickness of the spacer layer 148 needs to be increased. The spacer layer 148 with an increased thickness increases a vertical offset G2 between the highest position of the top surface of the spacer layer 148 and the top surface of the organic material stack layer 150, such that during subsequent fabrication of the second electrode 152, the second electrode 152 is prone to being broken due to the overly high offset G2, resulting in a decreased yield.

Therefore, embodiments of the present disclosure designs the first electrode 142 having the inclined surface 142s, and the angle θ included between the inclined surface 142s of the first electrode and the bottom surface 142b of the first electrode 142 is in a range from about 45 degrees to about 80 degrees. Thereby, the spacer layer 148 has a smoother topography and a better step coverage on the first electrode 142.

Thereby, some embodiments of the present disclosure provides an organic light emitting diode display device, which by modifying a sidewall of the first electrode into an inclined surface, can: provide smoother corners between the first section 1482 of the spacer layer 148 and the second section 1484 of the spacer layer 148, or between the second section 1484 of the spacer layer 148 and the third section 1486 of the spacer layer 148, further decreasing the chances of being broken of the second electrode 152 at the corners; allow the spacer layer 148 to effectively cover the first electrode 142 by using a thinner thickness, including covering the inclined surface 142s and a portion of the top surface of the blocking layer 146, assisting in decreasing the overall height of the organic light emitting diode unit 140; decrease the vertical offset G1 between the highest position and the lowest position of the top surface of the spacer layer 148, and decrease the vertical offset distance between the highest position of the top surface of the spacer layer 148 and the top surface of the organic material stack layer 150, further decreasing the chances of disconnection of the second electrode 152 due to overly high offset distances G1, G2.

FIG. 5A to FIG. 5J each show a cross-sectional view of an organic light emitting diode display device at different fabrication steps of a fabrication method according to some embodiments of the present disclosure.

Figure 5A:
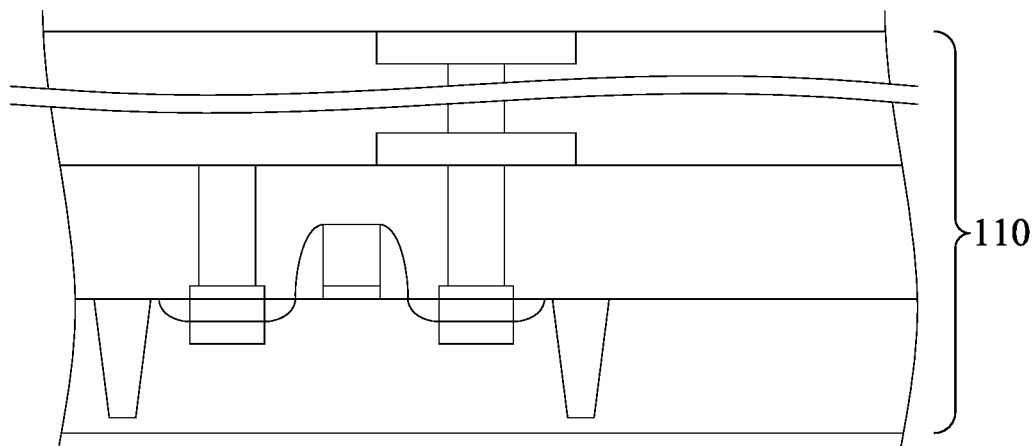
FIG. 5A to FIG. 5J each show a cross-sectional view of an organic light emitting diode display device at different fabrication steps of a fabrication method according to some embodiments of the present disclosure.

As shown in FIG. 5A, in step S10 an integrated circuit 110 is fabricated, wherein the integrated circuit 110 is fabricated using a semiconductor fabrication process. The integrated circuit 110 includes control circuits, power circuits, switch devices, and related integrated circuits.

Figure 5B:
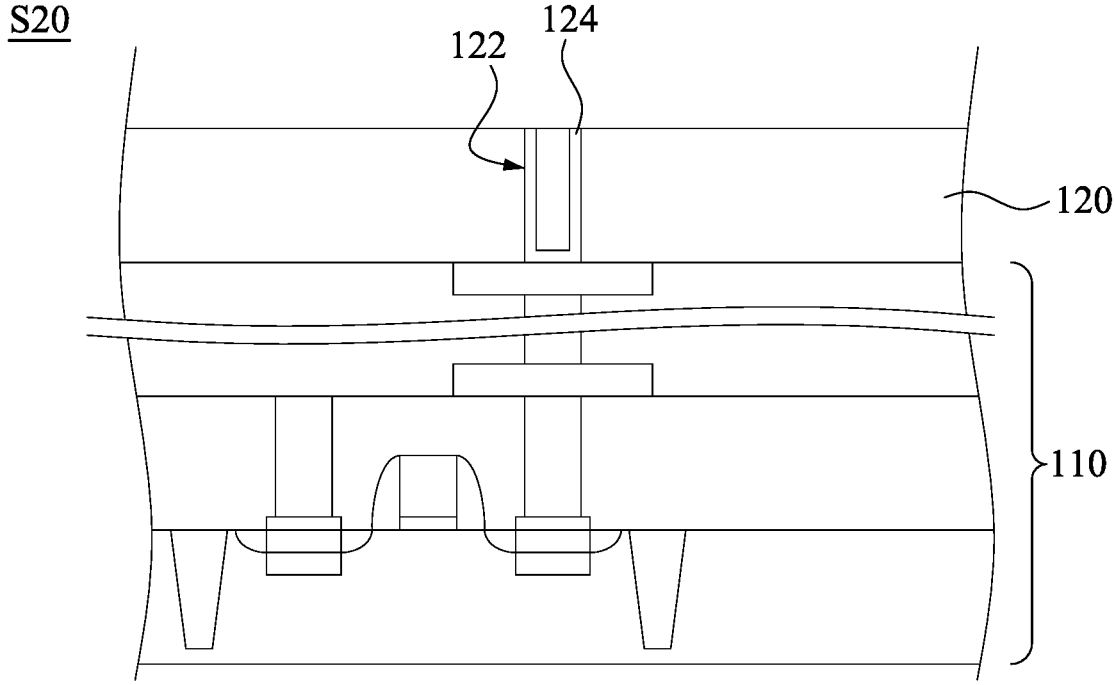

Then, as shown in FIG. 5B, in step S20 an insulation layer 120 and a via plug 122 are formed over the integrated circuit 110. In some embodiments of the present disclosure, the step of forming the insulation layer 120 and the via plug 122 can include deposing the insulation layer 120. The insulation layer 120 can be for example an inter-metal dielectric (IMD) having a low dielectric constant (k value), such as a dielectric constant lower than about 3.5. The insulation layer 120 can include a dielectric material, such as silicon oxide or other suitable material.

Then, an opening is formed in the insulation layer 120. The opening can be formed by, for example, forming a patterned photoresist layer (not shown in the figure) on the insulation layer 120, followed by performing an etching process to remove a portion of the insulation layer 120. In this way, the patterned photoresist layer serves as an etch mask to define the resulting opening in the insulation layer. The etching process can include one or more suitable etching processes. After etching, the patterned photoresist layer is removed.

Then, conductive material is deposited to fill the opening, such that the conductive material covers the insulation layer 120, and a planarization process is carried out, such as chemical mechanical polishing process, so as to remove excess portion of the conductive material above the top surface of the insulation layer 120, such that the via plug 122 is in the insulation layer 120. The material of the via plug 122 can include copper or copper alloys, or other suitable conductive materials, such as silver, gold, tungsten, aluminum, or other suitable materials. In some embodiments of the present disclosure, the via plug 122 can further include a barrier layer 124 arranged between the conductive material and the insulation layer 120.

Figure 5C:
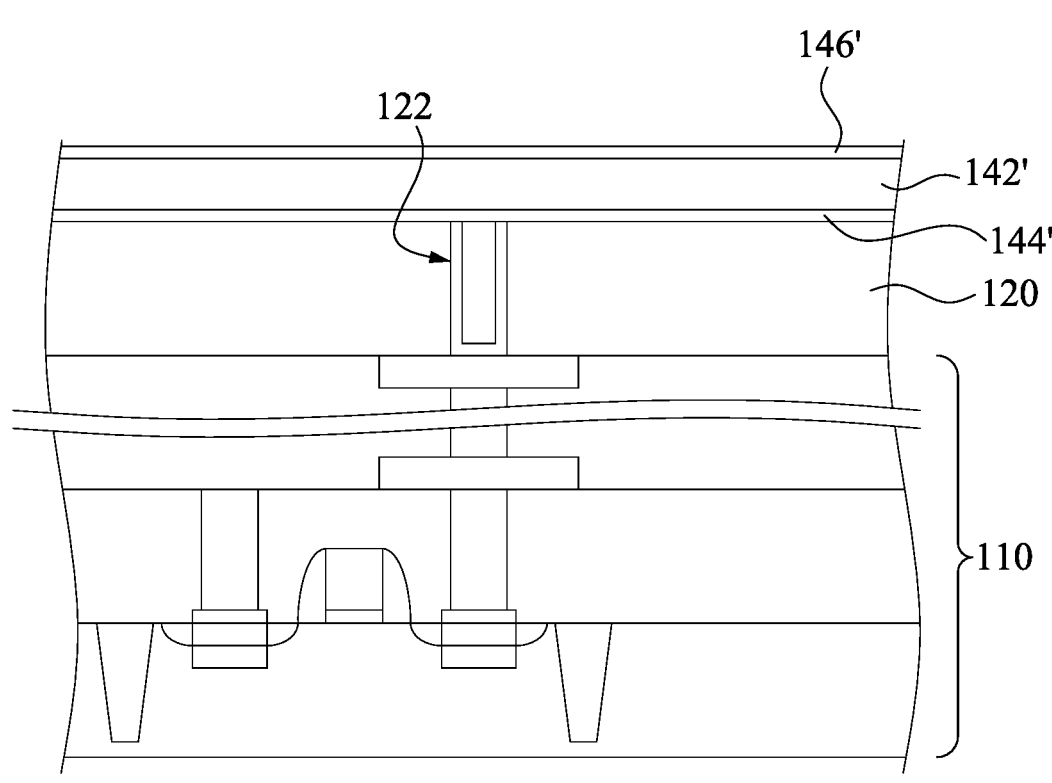

Then, as shown in FIG. 5C, in step S30 a blocking layer 144', an electrode layer 142', and another blocking layer 146' are sequentially deposited on the insulation layer 120. In some embodiments of the present disclosure, the material of the blocking layer 144' is metal nitride, such as titanium nitride or other suitable materials. The blocking layer 144' serves to separate the material of the electrode layer 142' from the insulation layer 120, so as to prevent the material of the electrode layer 142' from diffusing into the insulation layer 120. In some embodiments of the present disclosure, a thickness of the blocking layer 144' is from about 50 Å to about 150 Å. If the thickness of the blocking layer 144' is greater than about 150 Å, then the overly great thickness increases the vertical offset G1 (see FIG. 1) between the highest position and the lowest position of the top surface of the spacer layer 148 (see FIG. 1). If the thickness of the blocking layer 144' is less than about 50 Å, then the material of the electrode layer 142' may unwantedly diffuse into the insulation layer 120.

In some embodiments of the present disclosure, the material of the electrode layer 142' is metal or metal alloys, such that light emitted by the organic light emitting diode unit can be reflected by electrode layer 142' toward the light emitting direction. In order to reduce thickness of the electrode layer 142', the material of the electrode layer 142' can be a conductive material having a low resistance, such as an aluminum copper alloy (AlCu) or other suitable material, so as to avoid overly increasing the resistance when decreasing the thickness. In other embodiments, the material of the electrode layer 142' can include indium tin oxide, gold, tungsten, titanium, or other suitable materials.

In some embodiments of the present disclosure, by adjusting the process conditions of the deposition process, the surface flatness and reflectivity of the electrode layer 142' can be maintained while decreasing the thickness of the electrode layer 142', thus increasing the brightness and contrast of the organic light emitting diode display device. For example, the electrode layer 142' can be fabricated through physical vapor deposition (PVD), and the power and temperature of the physical vapor deposition can be further adjusted to further lower the deposition rate of the electrode layer 142', such that the deposited electrode layer 142' can have a desired surface flatness and thereby maintain the reflectivity of the electrode layer 142'. In some embodiments of the present disclosure, the power is from about 1500 W to about 3150 W. If the power is greater than about 3150 W, then the deposition rate may be excessively high and thus the electrode layer 142' may have an uneven surface. In some embodiments, the power can be less than about 2500 W, to achieve a desired surface flatness. If the power is less than about 1500 W, then the deposition cannot be carried out properly.

In some embodiments of the present disclosure, the deposition rate is about 30 Å per second to about 200 Å per second. If the deposition rate is greater than about 200 Å per second, then the overly high deposition rate may result in an uneven surface of the electrode layer 142'. If the deposition rate is less than 50 Å per second, then the wafer per hour (WPH) may too low.

In some embodiments of the present disclosure, a desired surface flatness of the electrode layer 142' means that the root mean square roughness (Rms) of the electrode layer 142' is less than about 30 Å, and that the difference between the deepest valley (Rv) and the highest peak (Rp) of the electrode layer 142' is less than about 300 Å. In some embodiments of the present disclosure, the thickness of the electrode layer 142' is about 300 Å to about 900 Å. If the thickness of the electrode layer 142' is greater than about 900 Å, then the overly great thickness increases the vertical offset G1 (see FIG. 1) between the highest position and the lowest position of the top surface of the spacer layer 148 (see FIG. 1), thereby increasing the chances of being broken of the second electrode 152 (see FIG. 1). If the thickness of the electrode layer 142' is less than about 300 Å, then the electrode layer 142' may be thin enough to be translucent, thus affecting the ability of the electrode layer 142' to reflect light such that light may not be reflected toward the light emitting direction.

In some embodiments of the present disclosure, the material of the blocking layer 146' is also metal nitride, such as titanium nitride or other suitable materials. A thickness of the blocking layer 146' is from about 30 Å to about 200 Å. If the thickness of the blocking layer 146' is great than about 200 Å, then the surface of the blocking layer 146' may be excessively rough, thus degrading the reflectivity of the blocking layer 146'. If the thickness of the blocking layer 146' is less than about 30 Å, then the overly thin blocking layer 146' may be damaged in subsequent fabrication processes, thus leading to unwanted contact between the organic material stack layer and the electrode layer 142'.

Figure 5D:
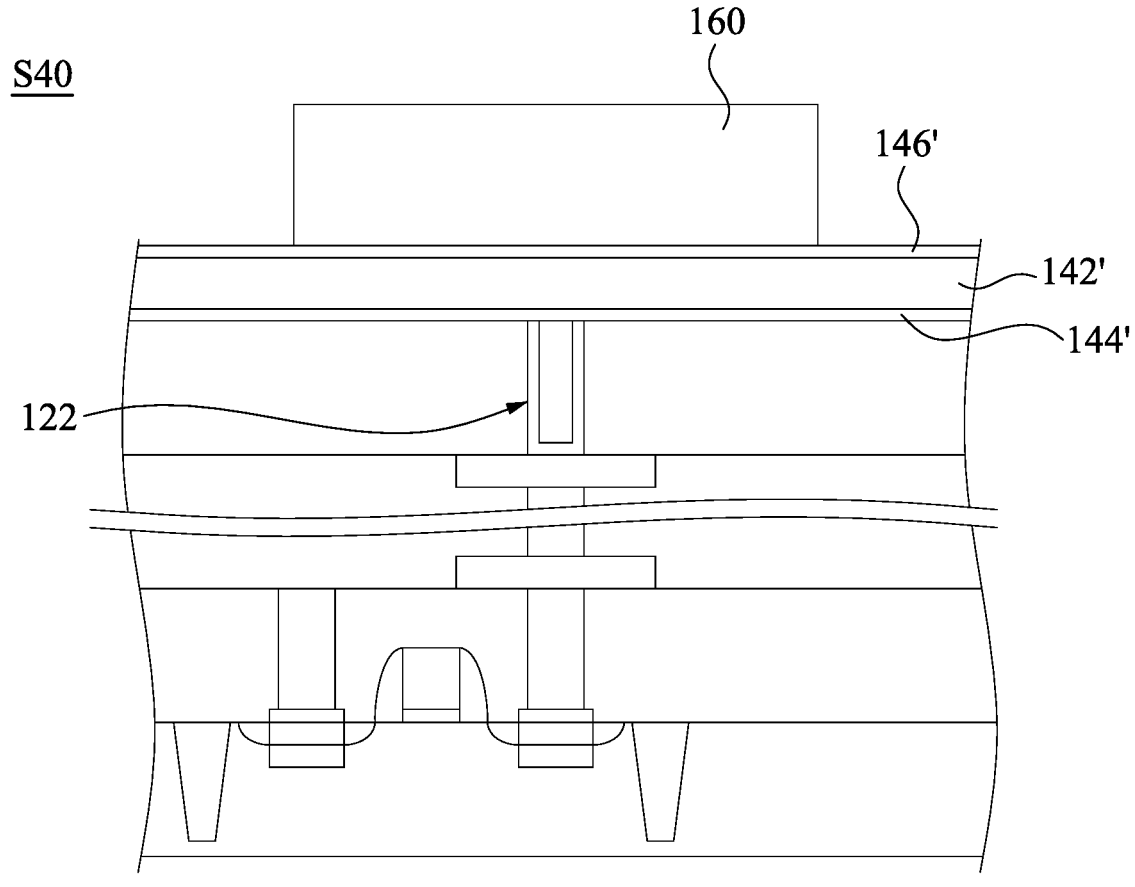

Then, as shown in FIG. 5D, in step S40 a positon of the first electrode is defined. Step S40 includes forming a patterned photoresist layer 160, so as to use the patterned photoresist layer 160 as a mask for defining the positon of the first electrode 142. The position of the patterned photoresist layer 160 at least covers the via plug 122.

Figure 5E:
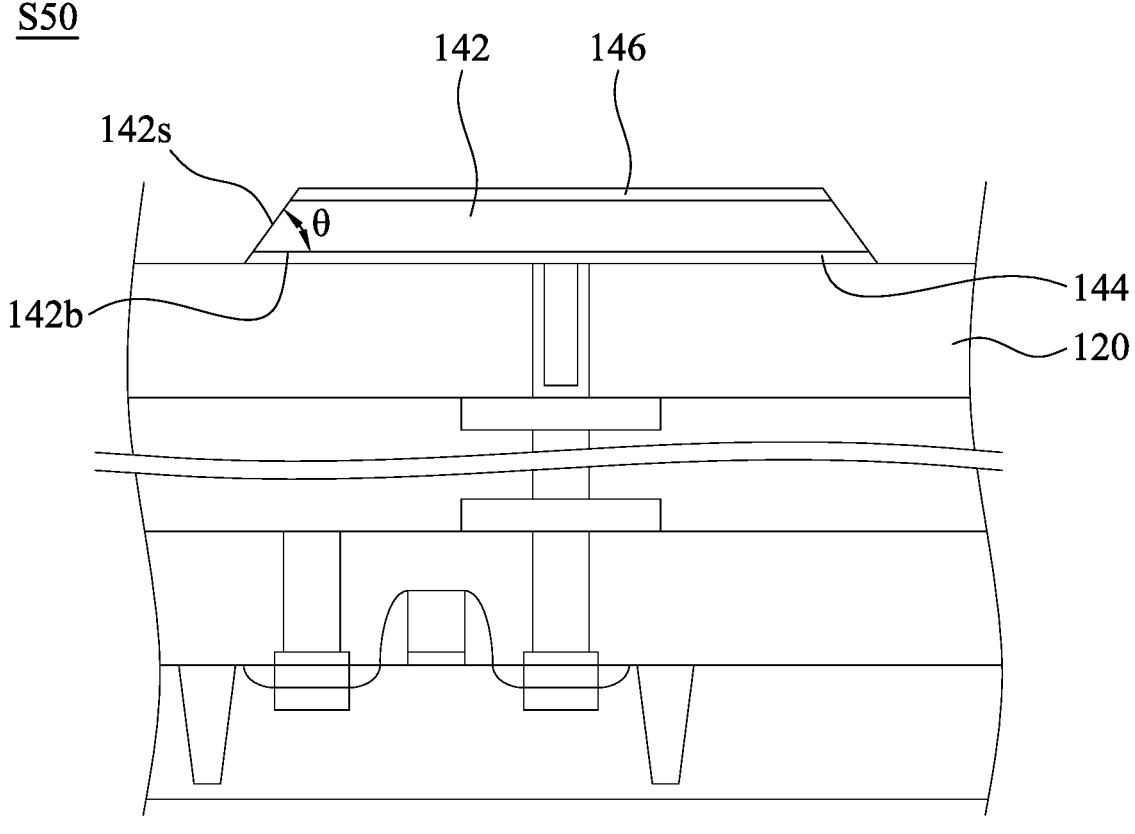

Then, refer to FIG. 5D and FIG. 5E, in step S50 the electrode layer 142' and the blocking layers 144', 146' are etched by using the patterned photoresist layer 160 as an etch mask, resulting in the patterned first electrode 142, and the patterned blocking layers 144, 146 positioned above and below the first electrode 142. The patterned photoresist layer 160 is removed after etching. As mentioned above, in some embodiments of the present disclosure, the first electrode 142 has an inclined surface 142s, and the angle θ included between the inclined surface 142s of the first electrode 142 and the bottom surface 142b of the first electrode is in a range from about 45 degrees to about 80 degrees.

For example, in some embodiments of the present disclosure, the etching process used is dry etching, and the pressure is from about 4 mTorr to about 10 mTorr, the source radio frequency is from about 600 W to about 1600 W, the bias radio frequency is from about 40 W to about 200 W, the etchant gas can include boron chloride ($BCl_3$), the etchant gas flow rate is from about 50 standard cubic centimeters per minute (sccm) to about 500 sccm. If etching conditions are outside these ranges, then the range of the included angle θ can be greater than about 80 degrees or less than about 45 degrees. If the included angle is greater than about 80 degrees, then the second electrode 152 (see FIG. 1) may be broken. If the included angle θ is less than about 45 degrees, then the interval between the organic light emitting diode units may be overly long, which in turn leading to reduced resolution of display or reduced light emitting area of the organic light emitting diode unit.

After etching, the blocking layer 144 and the blocking layer 146 are disposed on only the top surface and the bottom surface of the first electrode 142, and do not cover the inclined surface 142s of the first electrode 142. Given that the cross-sectional shape of the first electrode 142 is narrow at the top and wide at the bottom, the area of the bottom surface of the blocking layer 144 is greater than the area of the top surface of the blocking layer 146. In some embodiments of the present disclosure, a total thickness of the first electrode 142, the blocking layer 144, and the blocking layer 146 can be less than about 1000 Å, such as being controlled within a range of about 600 Å to about 800 Å.

Figure 5F:
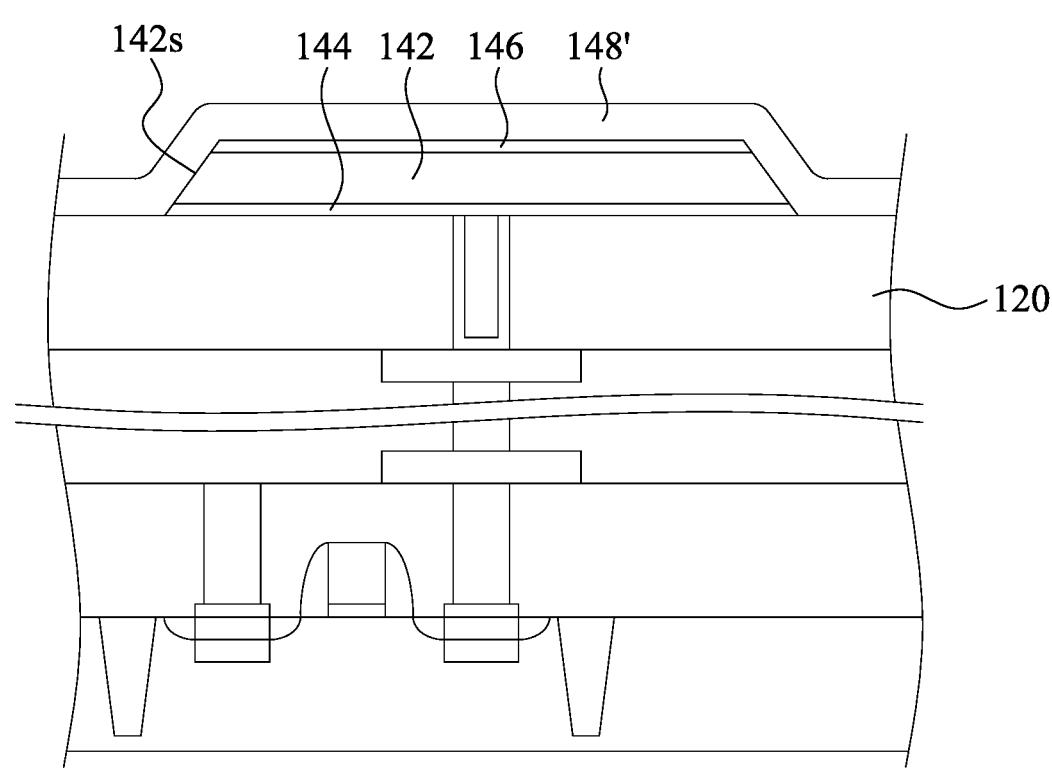

Then, as shown in FIG. 5F, in step S60 a dielectric layer 148' is covered on the first electrode 142, the blocking layers 144, 146, and the insulation layer 120. The material of the dielectric layer 148' can be the same as or different from the material of the insulation layer 120. For example, the material of the dielectric layer 148' can be an oxide, a nitride, an oxynitride or other suitable material, such as silicon oxide, silicon nitride, silicon oxynitride, or other suitable materials.

Given that the sidewall of the first electrode 142 is the inclined surface 142s, the dielectric layer 148' can therefore completely cover the first electrode 142 and the blocking layers 144, 146 with a thinner thickness, and has good step coverage without peeling at corners. Additionally, given that the total thickness of the first electrode 142, the blocking layer 144 and the blocking layer 146 can be less than about 1000 Å, the dielectric layer 148' can therefore cover the first electrode 142, the blocking layers 144, 146 and the insulation layer 120 more smoothly, without a high turning angle (over 80 degrees) at the corner.

For example, in some embodiments of the present disclosure, a thickness of the dielectric layer 148' is from about 100 Å to about 400 Å. If the thickness of the dielectric layer 148' is less than 100 Å, then the dielectric layer 148' might not completely cover the first electrode 142, the blocking layers 144, 146 and the insulation layer 120. If the thickness of the dielectric layer 148' is greater than 400 Å, then the overly great thickness increases the vertical offset distance G2 (see FIG. 1) between the highest position of the top surface of a subsequently formed spacer layer 148 (see FIG. 1) and the top surface of a subsequently formed organic material stack layer 150 (see FIG. 1), such that when subsequently fabricating a second electrode 152 (see FIG. 1), the second electrode 152 (see FIG. 1) is prone to being broken due to the overly high vertical offset G2 (see FIG. 1), thus resulting in a decreased yield.

Figure 5G:
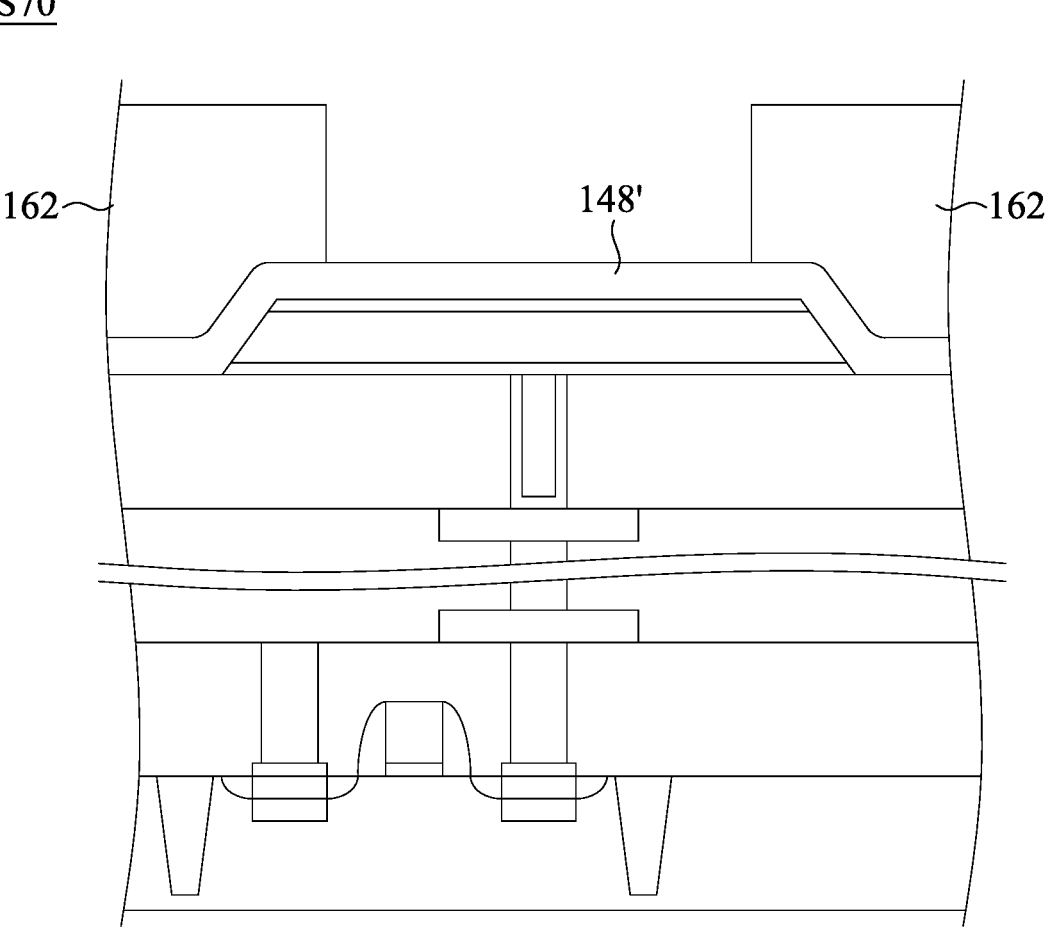

Then, referring to FIG. 5G, in step S70 another patterned photoresist layer 162 is formed on the dielectric layer 148 to define an opening for forming the organic light emitting diode unit.

Figure 5H:
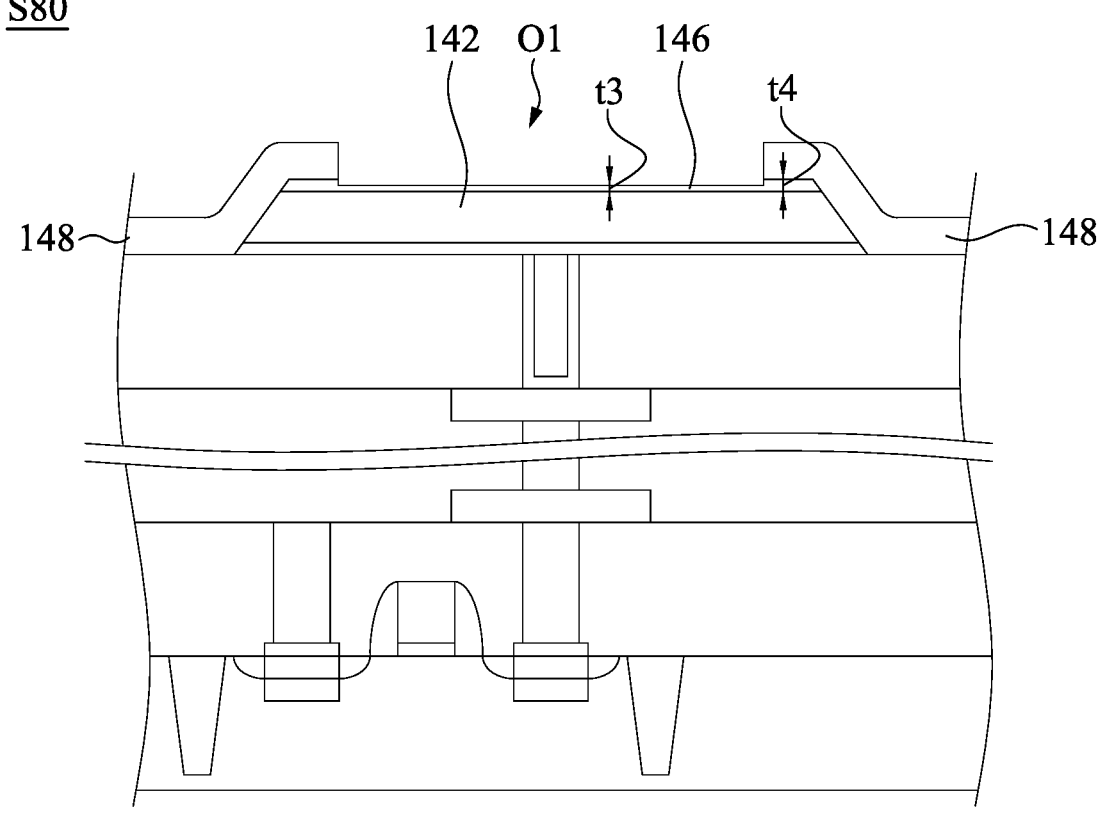

Afterward, referring to FIG. 5G and FIG. 5H, in step S80 the dielectric layer 148' is etched using the patterned photoresist layer 162 as an etch mask, resulting in the spacer layer 148 covering the sidewall of the first electrode 142. The patterned photoresist layer 162 is removed after etching.

For example, the portion of the dielectric layer 148' not covered by the patterned photoresist layer 162 is removed to define an opening region O1, and the portion of the dielectric layer 148' covered by the patterned photoresist layer 162 remains on the first electrode 142 and the insulation layer 120 to form the spacer layer 148. The opening region O1 extends through the spacer layer 148.

In some embodiments of the present disclosure, a thickness of the spacer layer 148 is from about 100 Å to about 400 Å. The opening ratio of the first electrode 142, namely the ratio of the area of the top surface of the blocking layer 146 exposed at the opening region O1 to the total area of the top surface of the blocking layer 146, is greater than or equal to about 98%.

Given that the blocking layer 146 serves as an etch stop layer during the fabrication of etching the dielectric layer 148', a portion of the blocking layer 146 not covered by the patterned photoresist layer 162 may be inevitably partially removed during the etching process, resulting in a thickness t4 of a portion of the blocking layer 146 between the spacer layer 148 and the first electrode 142 being greater than a thickness t3 of a portion of the blocking layer 146 exposed at the opening region O1. As mentioned above, an original thickness of the blocking layer 146, namely the thickness t4, or the thickness of the blocking layer 146' deposited in FIG. 5D, is greater than about 30 Å, to prevent the portion of the blocking layer 146 not covered by the patterned photoresist layer 162 from being overly etched in the etching process of step S80 and resulting in the first electrode 142 thereunder being exposed at the opening region O1.

Figure 5I:
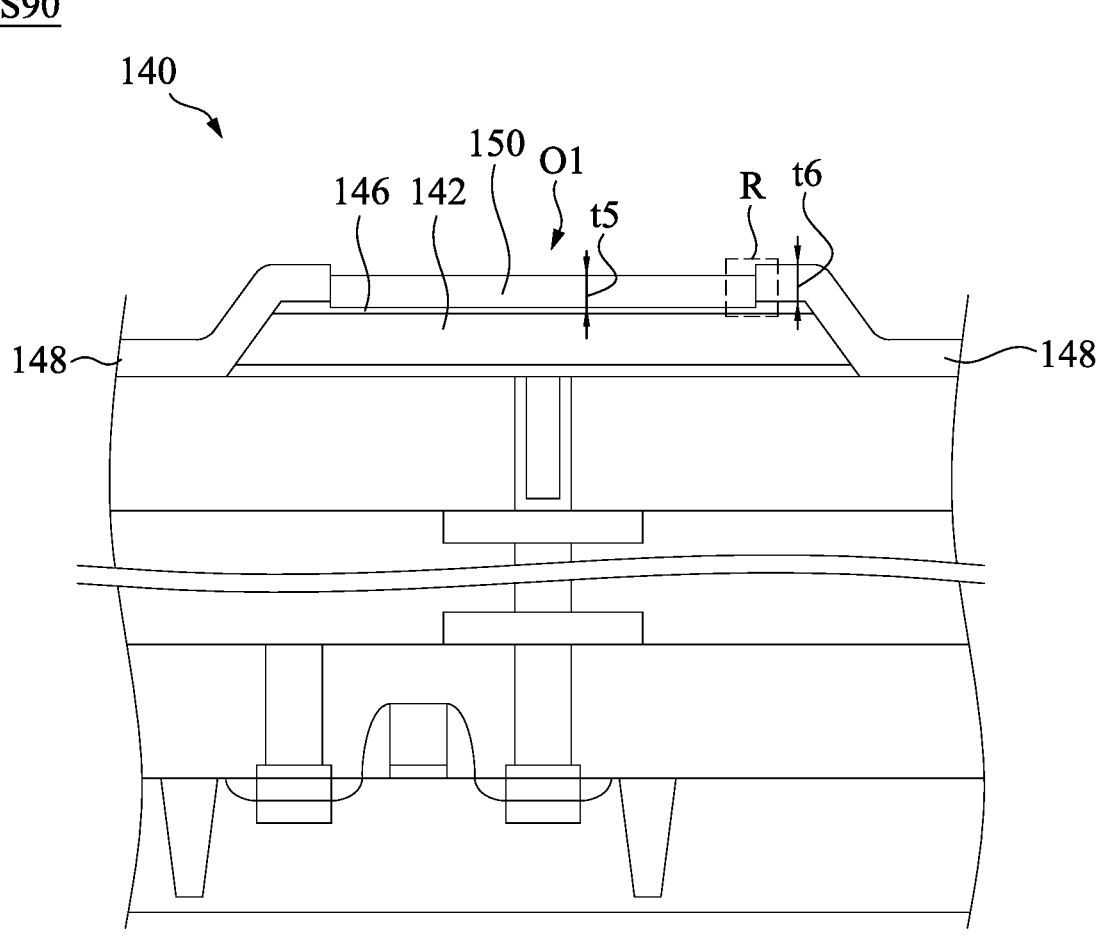
Figure 6:
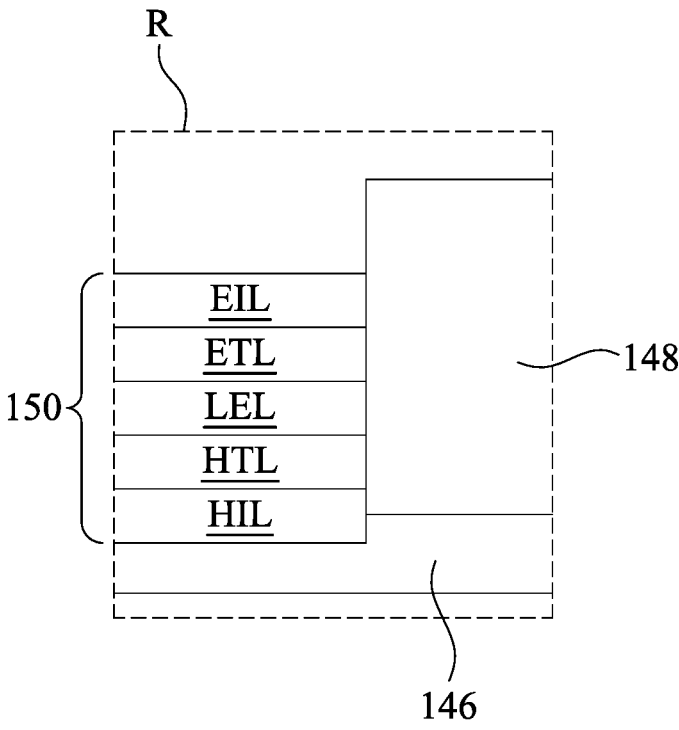
FIG. 6 is an enlarged view of region R of FIG. 5I.

Then, referring to FIG. 5I and FIG. 6, in step S90 as shown in FIG. 5I the organic material stack layer 150 is formed in the opening region O1 above the first electrode 142. FIG. 6 is an enlarged view of region R of FIG. 5I. In some embodiments of the present disclosure, the organic material stack layer 150 is a stack of multiple layers including different materials. For example, the organic material stack layer 150 can include a stack of hole-injecting layer (HIL), organic hole-transporting layer (HTL), organic light-emitting layer (LEL), electron-transporting layer (ETL), and electron-injecting layer (EIL). In other embodiments, the organic material stack layer 150 can further selectively include an electron-blocking layer and a hole-blocking layer.

In some embodiments of the present disclosure, the organic material stack layer 150 is formed on the blocking layer 146, and is filled in the opening region O1 defined by the spacer layer 148.

By selecting different materials for different organic light emitting layers, different organic light emitting diode units can emit light of different colors. In some embodiments of the present disclosure, the display device comprising a plurality of organic light emitting diode units can include organic light emitting diode units emitting red light, organic light emitting diode units emitting blue light, and organic light emitting diode units emitting green light.

In some embodiments of the present disclosure, the organic material stack layer 150 can be fabricated in the opening region O1 through evaporation. In some embodiments of the present disclosure, organic material stack layers of different colors can be formed in the opening regions of organic light emitting diode units of different colors through separate evaporation fabrications. For example, organic material stack layer for emitting red light can be first fabricated in the opening region of organic light emitting diode units for emitting red light, then organic material stack layer for emitting green light can be fabricated in the opening region of organic light emitting diode units for emitting green light, and finally organic material stack layer for emitting blue light can be fabricated in the opening region of organic light emitting diode units for emitting blue light. The organic material stack layers of the different organic light emitting diode units can be spaced apart by the spacer layers 148.

The organic material stack layer 150 and the first electrode 142 are spaced apart by the blocking layer 146, to prevent direct contact between the organic material stack layer 150 and the first electrode 142 resulting in unexpected reaction.

Referring again to FIG. 5I, in some embodiments of the present disclosure, a thickness t5 of the organic material stack layer 150 can be less than a thickness t6 of the spacer layer 148, such that the organic material stack layer 150 does not completely fill the opening region O1. In other words, the height of the top surface of the organic material stack layer 1550 is lower than the height of the highest position of the top surface of the spacer layer 148.

Figure 5J:
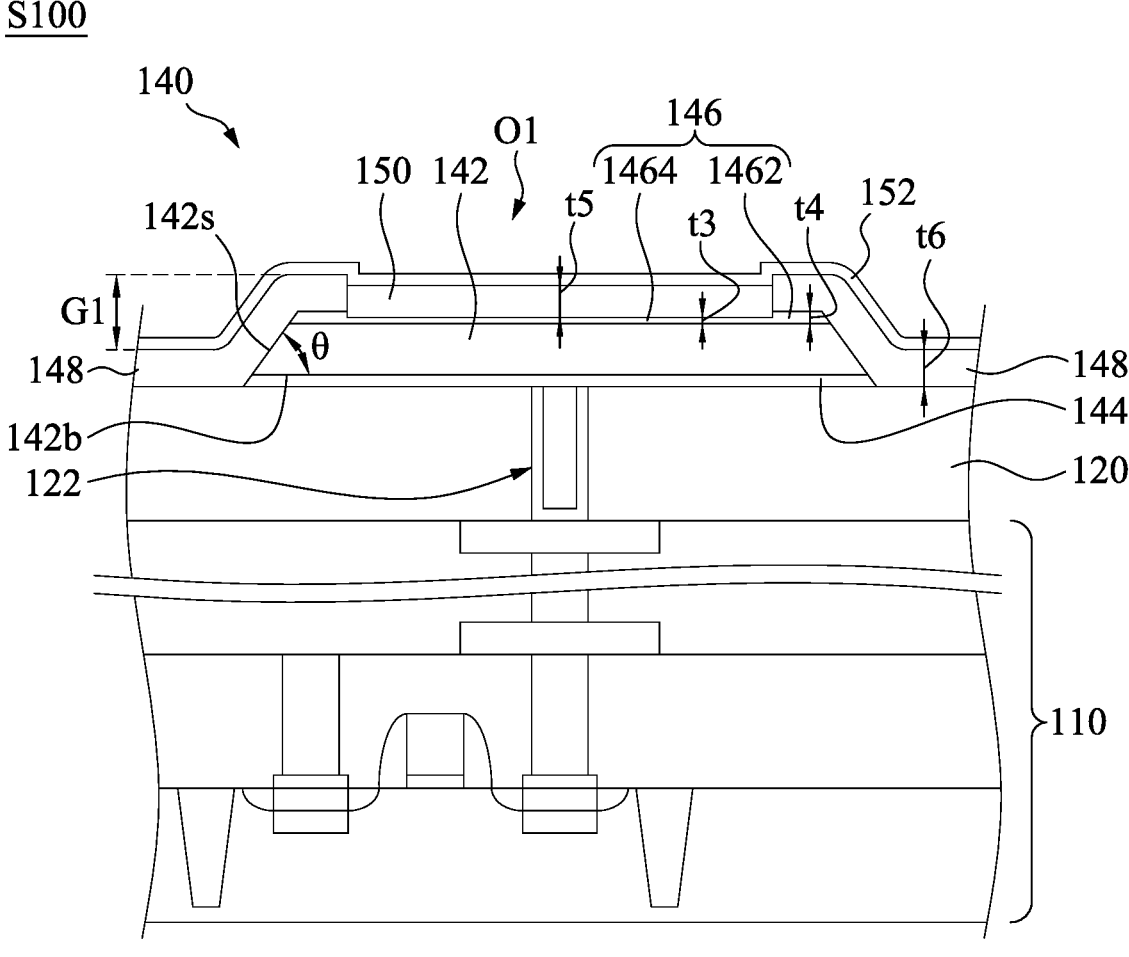

Then, referring to FIG. 5J, in step S100 the second electrode 152 is formed on the organic material stack layer 150. In some embodiments of the present disclosure, the second electrode 152 can be a shared electrode of multiple organic light emitting diode units 140. The second electrode 152 can be fabricated through evaporation onto the organic material stack layer 150 and the spacer layer 148. In some embodiments of the present disclosure, the material of the second electrode 152 is metal, such as silver. In other embodiments of the present disclosure, the material of the second electrode 152 can also be a transparent electrical conductive material, such as indium tin oxide or other suitable material.

As shown in FIG. 5J, the thickness t4 of a first portion 1462 of the blocking layer 146 between the spacer layer 148 and the first electrode 142 is greater than the thickness t3 of a second portion 1464 of the blocking layer 146 between the organic material stack layer 150 and the first electrode 142. The second electrode 152 is evenly formed on the top surface of the organic material stack layer 150 and the top surface of the spacer layer 148, and therefore has an undulating top surface. Some embodiments of the present disclosure lowers the difficulty for fabricating the second electrode 152, and effectively prevents unexpected breaking of the second electrode 152, by reducing the vertical offset distance G1 between the highest position and the lowest position of the top surface of the spacer layer 148.

Additionally, given that the shape of the first electrode is a trapezoid having a slanted corner, and that the angle θ included between the inclined surface 142s of the first electrode and the bottom surface 142$b$ of the first electrode is in a range between about 45 degrees to 80 degrees, the spacer layer 148 can have a smoother surface shape. Therefore, the second electrode 152 arranged on the spacer layer 148 can also avoid rising at great (i.e. sharp) angles, thereby reducing the risk of breaking.

Figure 7:
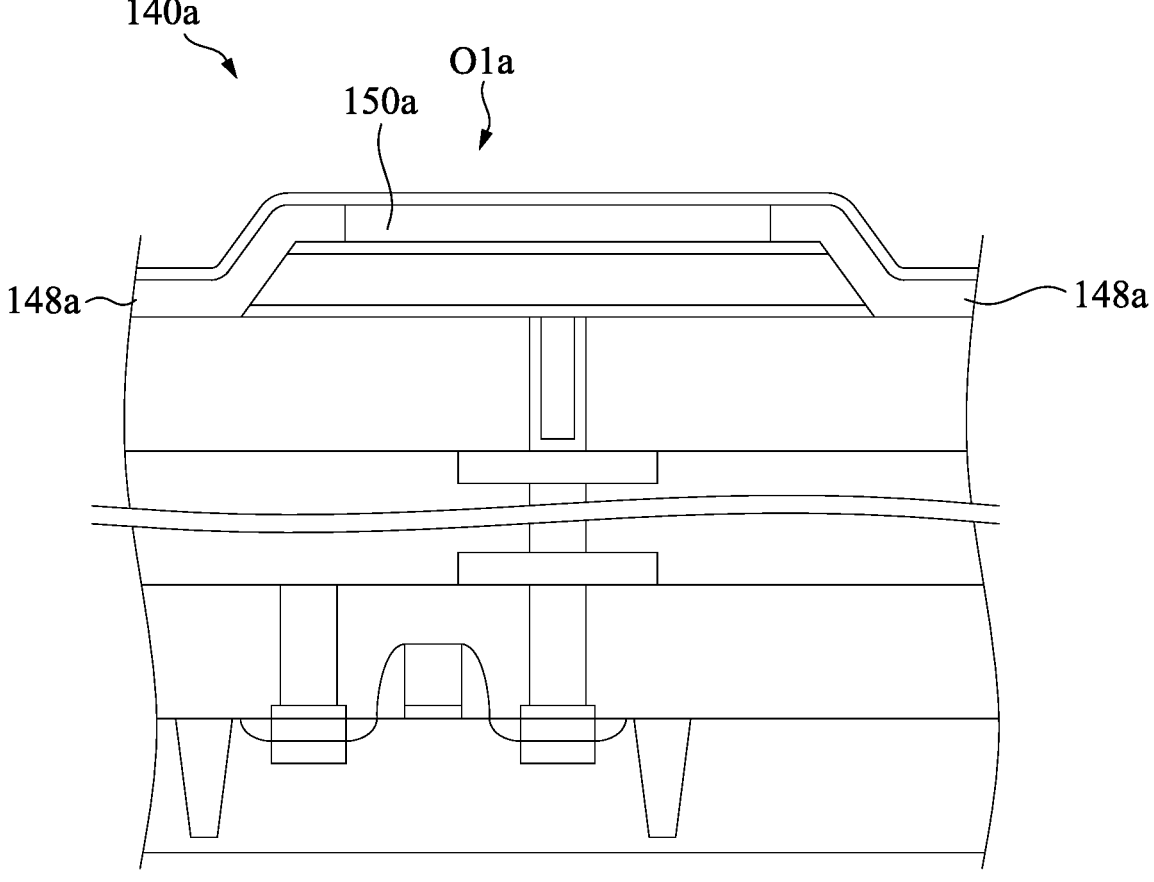
FIG. 7 and FIG. 8 each show a cross-sectional view of an organic light emitting diode display device according to other embodiments of the present disclosure.
Figure 8:
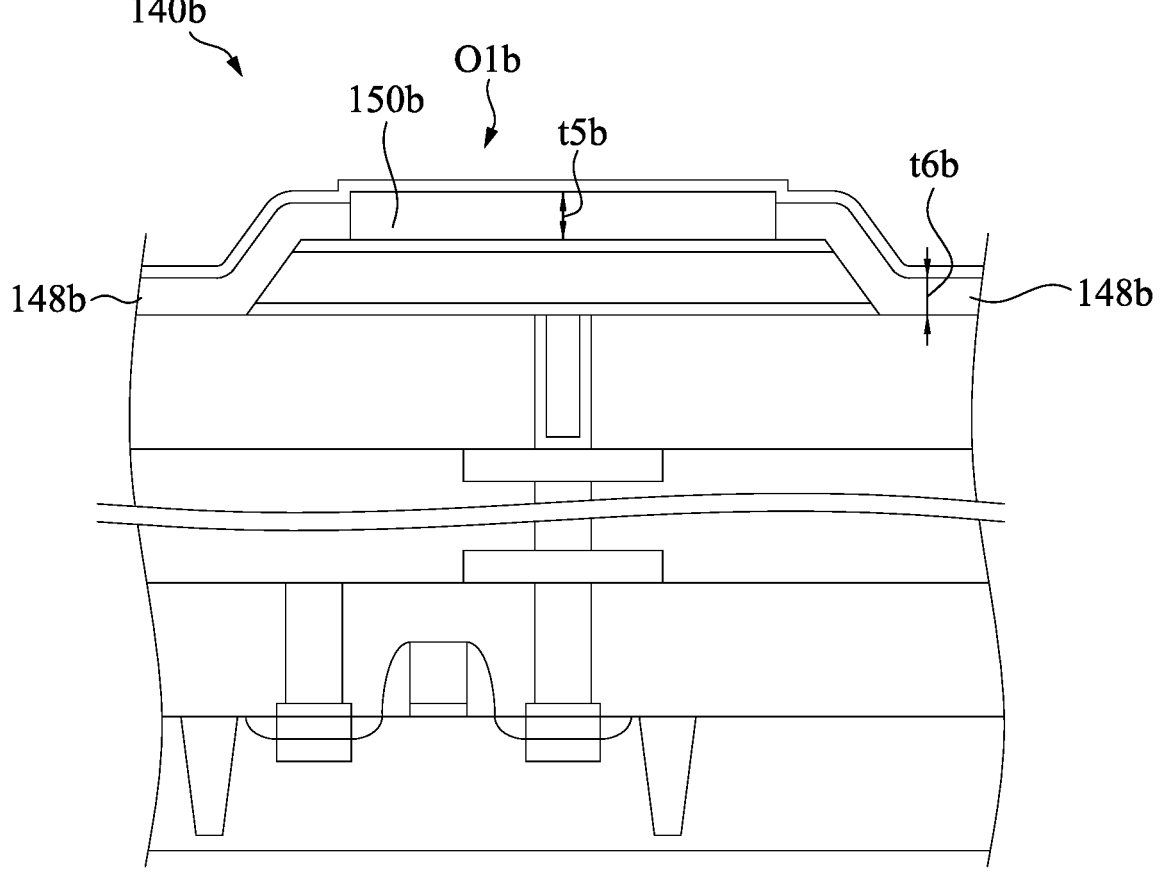

FIG. 7 and FIG. 8 each show a cross-sectional view of an organic light emitting diode display device according to different embodiments of the present disclosure. In some embodiments, such as the organic light emitting diode unit 140$a$ shown in FIG. 7, the organic material stack layer 150$a$ substantially completely fills the opening region Ola. Namely, the top surface of the organic material stack layer 150$a$ is substantially level with the highest position of the spacer layer 148$a$. In other embodiments, such as the organic light emitting diode unit 140$b$ shown in FIG. 8, the thickness t5$b$ of the organic material stack layer 150$b$ can be greater than the thickness t6$b$ of the spacer layer 148$b$, thus the organic material layer 150$b$ completely fills the opening region Olb and protrudes from the spacer layer 148$b$, such that the top surface of the organic material stack layer 150$b$ is higher than the highest position of the top surface of the spacer layer 148$b$.

In summary, some embodiments of the present disclosure can effectively reduce the thickness of the spacer layer by designing the sidewall of the first electrode as an inclined surface, such that the spacer layer has a smoother surface shape, thereby reducing the risk of breaking of the second electrode.

Figure 9:
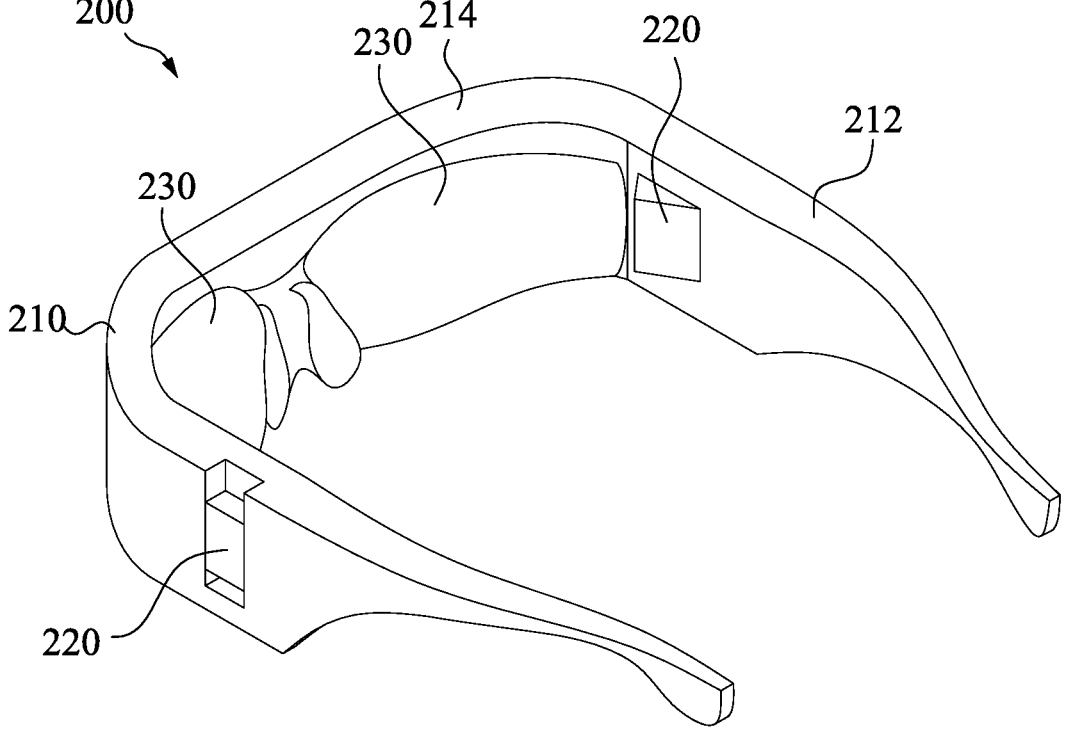
FIG. 9 shows a schematic diagram of an exterior of a headgear device according to some embodiments of the present disclosure.

Next, FIG. 9 shows a schematic diagram of an exterior of a headgear device according to some embodiments of the present disclosure. A headgear device 200 includes a frame 210, a projection device 220 arranged at two sides of the frame 210, and an imaging screen 230 arranged at the front side of the frame 210. For example, the frame 210 has ear hook portions 212 at two sides and a panel portion 214 at a front side. The panel portion 214 has at least one opening. The imaging screen 230 is embedded in the panel portion 214. The quantity of the projection device 220 can be one or multiple. If the quantity of the projection device 220 is two, then the two projection devices 220 are respectively arranged on the ear hook portions 212, to project onto the imaging screen 230.

In some embodiments of the present disclosure, the projection device 220 of the headgear device 200 includes the abovementioned organic light emitting diode display device (such as the organic light emitting diode display device 100 shown in FIG. 1). The structure and fabrication of this organic light emitting diode display device is described in the above embodiments, and is not further described herein.

In some embodiments of the present disclosure, the projection device 220 can be controlled by a processor and receive signals from the processor to output corresponding imaging lights. In some embodiments of the present disclosure, one or more reflective or optical lenses can be arranged between the projection device 220 and the imaging screen 230, for adjusting the light path of the imaging light outputted by the projection device 220. In some embodiments of the present disclosure, the projection device 220 can further include a heat dissipation unit. The heat dissipation unit can be for example a heat sink, a heat dissipation film, etc. The heat dissipation u nit can be thermally coupled to the organic light emitting diode array, to prevent heat from building up in the projection device 220 and causing damage.

In some embodiments of the present disclosure, the headgear device 200 can be a transmissive headgear device, namely an image seen by the user can be a combination of an image provided by the projection device 220 and an image of the outside environment. In some embodiments of the present disclosure, the headgear device 200 can be a reflective headgear device, namely an image seen by the user is an image provided by the projection device 220.

Figure 10:
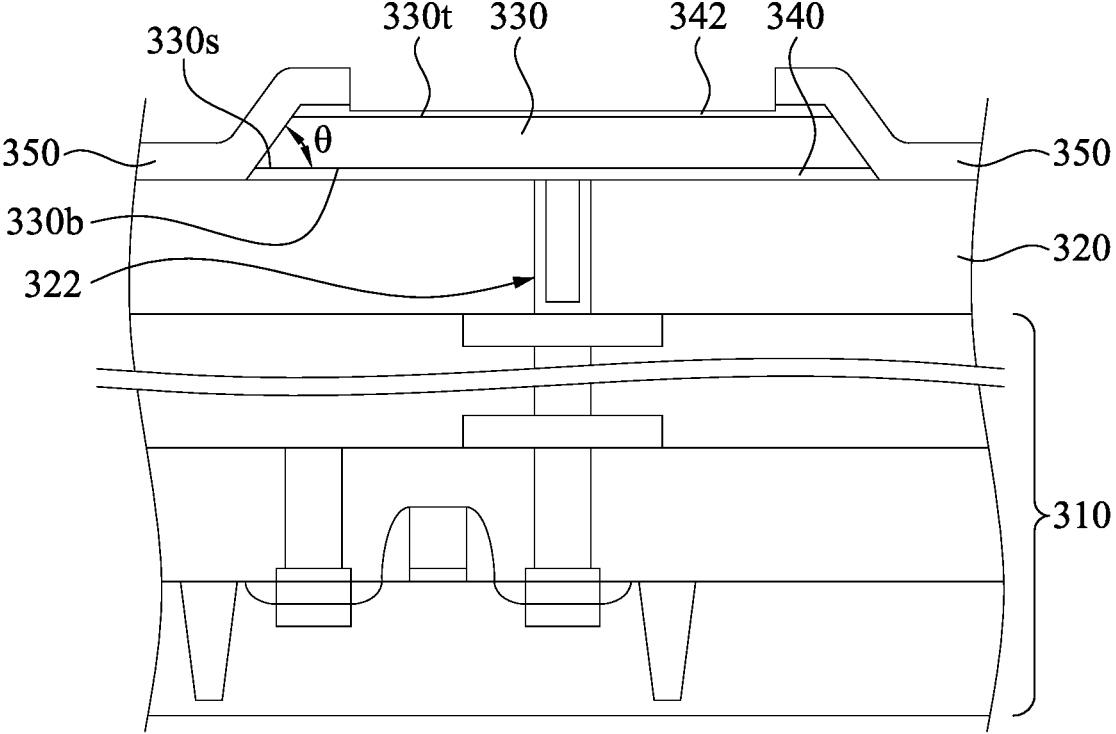
FIG. 10 and FIG. 11 each show a cross-sectional view of a liquid crystal on silicon display panel at different fabrication steps according to some embodiments of the present disclosure.
Figure 11:
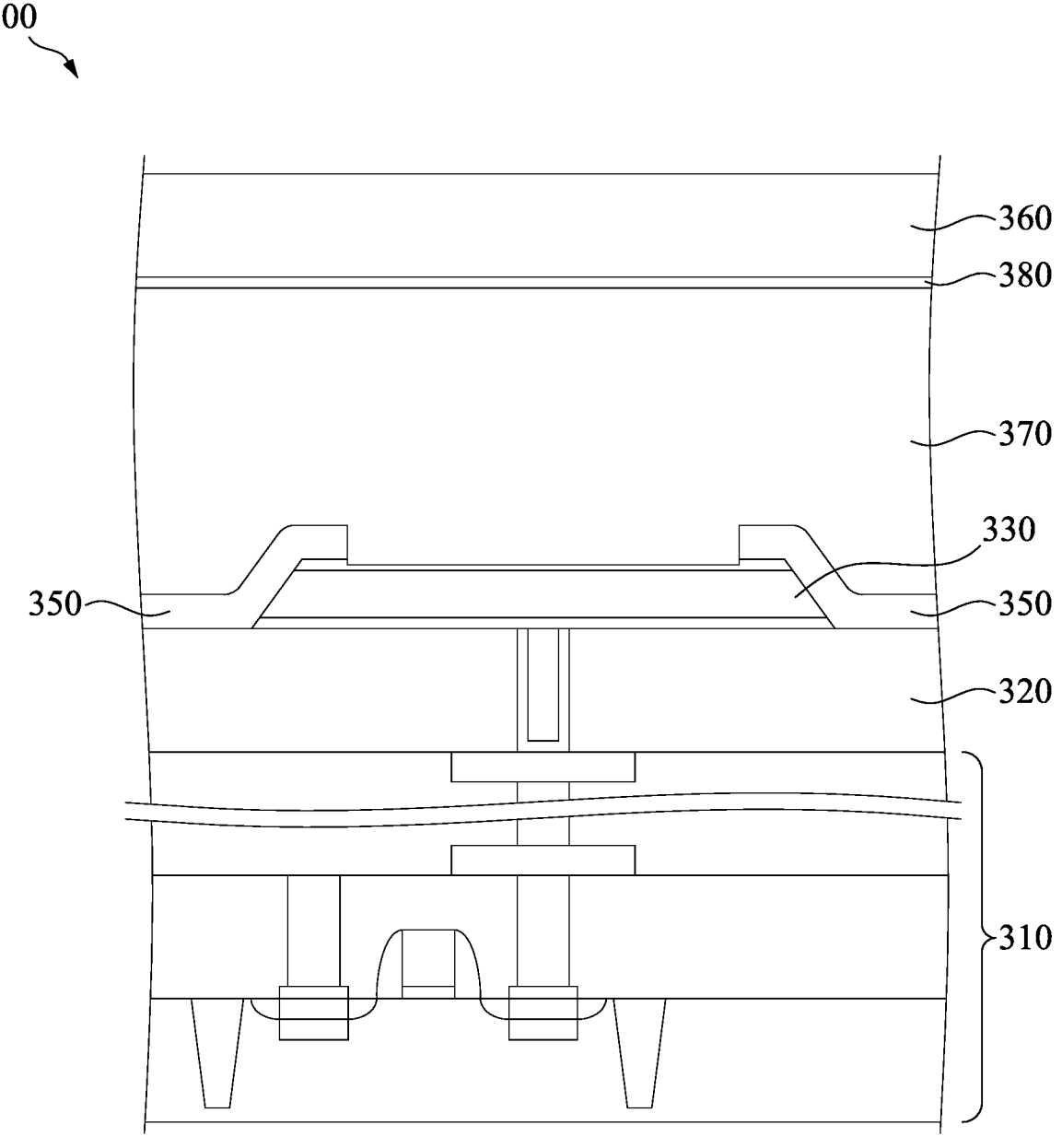

FIG. 10 and FIG. 11 each show a cross-sectional view of a liquid crystal on silicon (LCOS) display panel at different fabrication steps according to some embodiments of the present disclosure. FIG. 10 shows a fabricated structure, including an integrated circuit 310, an insulation layer 320 disposed on the integrated circuit 310, a plurality of first electrodes 330 (the figure shows only one for simplicity) disposed on the insulation layer 320, blocking layers 340, 342 disposed at two sides of the first electrode 330, and a spacer layer 350 disposed at a sidewall of the first electrode 330. Each of the first electrodes 330 is electrically connected to the integrated circuit 310 thereunder through a via plug 322 disposed in the insulation layer 320.

Method for fabricating the integrated circuit 310, the insulation layer 320, the via plug 322, the first electrode 330, the blocking layers 340, 342, and the spacer layer 350 can reference steps S10 to step S80 described by FIGS. 5A to 5H, and is not further repeated herein.

Referring next to FIG. 11, FIG. 11 shows an opposite substrate 360 and a liquid crystal layer 370. A second electrode 380 is disposed on the opposite substrate 360. The second electrode 380 is a shared electrode. In some embodiments of the present disclosure, the second electrode 380 covers the entire surface of the opposite substrate 360 facing the first electrode 330. The second electrode 380 can be an electrically conductive material having a high translucency, such as indium oxide ($In_2O_3$), tin oxide ($SnO_2$), indium tin oxide (ITO), zinc oxide (ZnO), or other suitable material.

In some embodiments of the present disclosure, the liquid crystal layer 370 can be first formed on the spacer layer 350 and the first electrode 330, and then be mated to the opposite substrate 360 for completing fabrication, thereby obtaining an LCOS display panel 300. In some embodiments of the present disclosure, the opposite substrate 360 can be first placed over the integrated circuit 310 but leaving a space there-between, and then the liquid crystal layer 370 is injected between the integrated circuit 310 and the opposite substrate 360. In some embodiments of the present disclosure, an alignment layer can be arranged between the liquid crystal layer 370 and the first electrode 330, and between the liquid crystal layer 370 and the second electrode 380.

By modifying the sidewall of the first electrode 330 into an inclined surface, the required thickness of the spacer layer 350 can be effectively reduced, and the spacer layer 350 can have good step coverage on the first electrode 330 and have a smoother surface shape, thereby solving the issue of breaking or peeling of the spacer layer 350 at corners.

Figure 12:
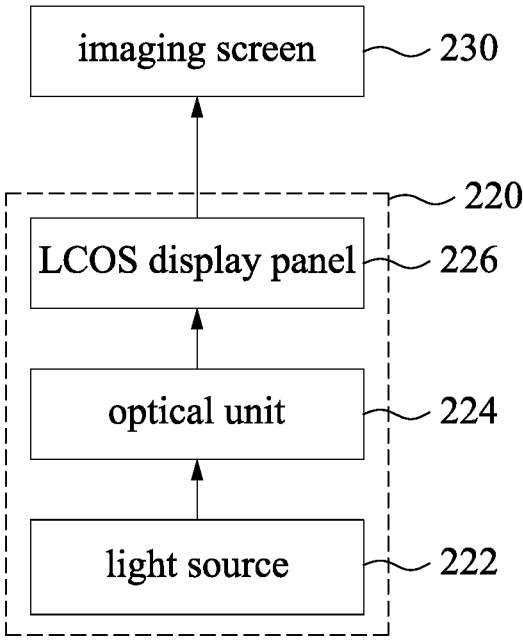
FIG. 12 shows a block diagram of a projection device in a headgear device according to some embodiments of the present disclosure.

FIG. 12 shows a block diagram of a projection device in a headgear device according to some embodiments of the present disclosure. The projection device 220 can be applied to the headgear device 200 such as the one shown in FIG. 9. In some embodiments of the present disclosure, the projection device 220 includes a light source 222, an optical unit 224, and an LCOS display panel 226. The LCOS display panel 226 is configured to receive colored light from the light source and image signals from a controller, to integrate and emit imaging light for projection.

In some embodiments of the present disclosure, the optical unit 224 in the projection device 220 includes one or more optical lenses disposed at a light emitting side of the light source 222, for adjusting the light path of the light emitted by the light source 222. In some embodiments of the present disclosure, the light emitted by the light source 222 is white light, the optical unit 224 includes a beam splitting unit disposed between the light source 222 and the LCOS display panel 226. The white light emitted by the light source 222 can pass through the optical lens and enter the beam splitting unit, such that the white light emitted by the light source 222 is split into the three primary colors of light, red light, blue light, and green light, after passing through the beam splitting unit. The red light, the blue light, and the green light are emitted according to a timing sequence.

In other embodiments, the light source 222 can be controlled by a program such as a processor, such that the light source 222 can switch very rapidly to emit according to a timing sequence the three primary colors of light, the red light, the blue light, and the green light. In this case the beam splitting unit may be omitted.

In some embodiments of the present disclosure, the optical unit 224 can include a polarizing beam splitter (PBS). The three primary colors of light, regardless of being obtained by using the beam splitting unit to split white light emitted by the light source 222, or being directly emitted by the light source 222, enters the LCOS display panel 226 after passing through the polarizing beam splitter, and the LCOS display panel 226 outputs a full color image beam to be outputted to the imaging screen 230 for being displayed.

Similarly, one or more reflective lenses or optical lenses can be configured between the LCOS display panel 226 and the imaging screen 230, for adjusting the light path of the image beam outputted by the LCOS image display panel 226. In some embodiments of the present disclosure, the projection device 220 can further include a heat dissipating unit. The heat dissipating unit can be for example a heat sink, a heat dissipating film, etc. The heat dissipating unit can be thermally coupled to the light source 222, to prevent heat from building up in the light source 222 and causing damage.

In summary, some embodiments of the present disclosure provide a display device and a method for fabricating the same. By designing the sidewall of the first electrode, such as the anode, of the display unit of the display device as an inclined surface, the required thickness of the spacer layers is effectively reduced, and the spacer layer can have a smoother surface shape, thereby preventing the issue of disconnection of the second electrode.

According to embodiments of the present disclosure, an organic light emitting diode display device includes an integrated circuit, a first electrode, a spacer layer, an organic material stack layer, and a second electrode. The first electrode is electrically connected to the integrated circuit. The first electrode has a top surface, a bottom surface, and an inclined surface connecting the top surface and the bottom surface. An angle included between the inclined surface and the lower surface is in a range from about 45 degrees to about 80 degrees. The spacer layer covers the inclined surface of the first electrode. The organic material stack layer is disposed on the first electrode. The second electrode is disposed on the organic material stack layer and the spacer layer.

According to embodiments of the present disclosure, a method for fabricating an organic light emitting diode display device includes forming an electrode layer on an insulation layer, wherein the electrode layer is electrically connected to an integrated circuit through a via plug in the insulation layer. Then, the electrode layer is etched, wherein the electrode layer is etched by dry etching, and a reactant gas of the dry etching include boron chloride ($BCl_3$), such that a first electrode has a top surface, a bottom surface, and an inclined surface connecting the top surface and the bottom surface. A spacer layer is formed to cover the inclined surface of the first electrode. An organic material stack layer is formed on the first electrode. A second electrode is formed on the organic material stack layer and the spacer layer.

According to embodiments of the present disclosure, a method for fabricating a liquid crystal on silicon (LCOS) display panel include forming an electrode layer on an insulation layer, wherein the electrode layer is electrically connected to an integrated circuit through a via plug in the insulation layer, and a deposition rate for forming the electrode layer is from about 30 Å of thickness per second to about 200 Å of thickness per second, such that a thickness of the electrode layer is between about 300 Å to about 900 Å. Then, the electrode layer is etched, so as to obtain a first electrode. A spacer layer covering a sidewall of the first electrode is formed. A liquid crystal layer and a second electrode are formed on the first electrode and the spacer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an organic light emitting diode display device, comprising:

forming an electrode layer on an insulation layer, wherein the electrode layer is electrically connected to an integrated circuit through a via plug in the insulation layer;

etching the electrode layer to obtain a first electrode, wherein the etching of the electrode layer is a dry etching using at least boron chloride ($BCl_3$) as an etchant gas, and the dry etching is performed such that the first electrode has a top surface, a bottom surface, and an inclined surface connecting the top surface and the bottom surface;

forming a spacer layer covering the inclined surface of the first electrode, wherein the spacer layer overlaps a first partial region of the top surface of the first electrode and non-overlaps a second partial region of the top surface of the first electrode;

forming an organic material stack layer on the first electrode;

forming a second electrode on the organic material stack layer and the spacer layer, wherein the spacer layer has a horizontal surface in direct contact with the second electrode to form an interface, wherein the interface formed by the direct contact between the second electrode and the horizontal surface of the spacer layer has a portion at a lower level than the top surface of the first electrode; and forming a blocking layer over the first electrode prior to forming the spacer layer, wherein after forming the spacer layer, the blocking layer has a stepped top surface comprising a lower step, an upper step higher than the lower step, and a step rise extending upwards from the lower step to the upper step, wherein the lower step of the stepped top surface of the blocking layer overlaps with an entirety of the organic material stack layer.

2. The method according to claim 1, wherein forming the spacer layer comprises:

depositing a dielectric layer on the first electrode, wherein a thickness of the dielectric layer is from about 100 Å to about 400 Å; and removing a portion of the dielectric layer to define an opening region on the first electrode.

3. The method according to claim 2, wherein the organic material stack layer is filled in the opening region.

4. The method according to claim 2, wherein a thickness of the blocking layer is from about 30 Å to about 200 Å.

5. The method according to claim 4, wherein removing the portion of the dielectric layer to define the opening region on the first electrode comprises removing a portion of the blocking layer, such that a thickness of a first portion of the blocking layer between the spacer layer and the first electrode is greater than a thickness of a second portion of the blocking layer between the first electrode and the organic material stack layer.

6. The method according to claim 1, wherein an angle included between the inclined surface and the bottom surface of the first electrode is from about 45 degrees to about 80 degrees.

7. The method according to claim 1, wherein a pressure of the dry etching is from about 4 mTorr to about 10 mTorr.

8. The method of claim 1, wherein the spacer layer overlaps the upper step of the stepped top surface of the blocking layer, but non-overlaps the lower step of the stepped top surface of the blocking layer.

9. The method of claim 1, wherein the interface formed by the direct contact between the second electrode and the horizontal surface of the spacer layer is at a lower level than a topmost position of the inclined surface of the first electrode.

10. A method for fabricating an organic light emitting diode display device, comprising:

forming a dielectric layer over an integrated circuit and a via plug in the dielectric layer;

depositing a bottom electrode material over the via plug, and a top diffusion blocking material over the bottom electrode material;

patterning the bottom electrode material into a bottom electrode and patterning the top diffusion blocking material into a top diffusion blocking layer, the bottom electrode having a lateral dimension increasing from a top surface of the bottom electrode to a bottom surface of the bottom electrode;

forming a spacer layer over the bottom electrode;

etching the spacer layer to form an opening in the spacer layer, wherein the spacer layer overlaps the top surface of the bottom electrode after etching the spacer layer, wherein after etching the spacer layer to form the opening in the spacer layer, the top diffusion blocking layer has a stepped top surface comprising a lower step, an upper step higher than the lower step, and a step rise extending upwards from the lower step to the upper step;

forming an organic material stack in the opening, wherein the organic material stack non-overlaps with the upper step of the stepped top surface of the top diffusion blocking layer; and forming a top electrode over the organic material stack and the spacer layer, wherein the top electrode is in direct contact with a horizontal surface of the spacer layer to form a horizontal interface with the horizontal surface of the spacer layer, and the horizontal interface has a portion at a lower level than the top surface of the bottom electrode.

11. The method of claim 10, wherein the bottom electrode has a trapezoidal cross-section.

12. The method of claim 10, further comprising depositing a bottom diffusion blocking material on the via plug before depositing the bottom electrode material, and patterning the bottom diffusion blocking material into a bottom diffusion blocking layer.

13. The method of claim 12, wherein the bottom diffusion blocking layer has a lateral dimension increasing from a top surface of the bottom diffusion blocking layer to a bottom surface of the bottom diffusion blocking layer.

14. The method of claim 10, wherein the top diffusion blocking layer has a lateral dimension increasing from the stepped top surface of the top diffusion blocking layer to a bottom surface of the top diffusion blocking layer.

15. The method of claim 10, wherein the spacer layer overlaps the upper step of the stepped top surface of the top diffusion blocking layer, but non-overlaps the lower step of the stepped top surface of the top diffusion blocking layer.

16. A method for fabricating an organic light emitting diode display device, comprising:

forming an inter-metal dielectric (IMD) layer over a substrate;

forming a metal via in the IMD layer;

forming in sequence a bottom diffusion blocking material, a bottom electrode material, and a top diffusion blocking material over the metal via;

patterning the top diffusion blocking material into a top diffusion blocking layer;

patterning the bottom electrode material into a bottom electrode having a trapezoidal cross-section;

patterning the bottom diffusion blocking material into a bottom diffusion blocking layer;

forming a patterned spacer layer overlapping a partial region of a top surface of the top diffusion blocking layer, wherein after forming the patterned spacer layer, the top diffusion blocking layer has a stepped top surface comprising a lower step, an upper step higher than the lower step, and a step rise extending upwards from the lower step to the upper step;

forming an organic material stack in the patterned spacer layer, wherein the lower step of the stepped top surface of the top diffusion blocking layer is in contact with an entire bottom surface of the organic material stack; and forming a top electrode over the organic material stack, wherein the patterned spacer layer is a single-layered film in contact with both the top electrode and the bottom electrode, wherein the patterned spacer layer has a horizontal surface in direct contact with a horizontal surface of the top electrode to form a horizontal interface, wherein the horizontal interface formed by the direct contact between the top electrode and the patterned spacer layer has a portion at a lower level than a top surface of the bottom electrode.

17. The method of claim 16, wherein the top diffusion blocking layer has a trapezoidal cross-section.

18. The method of claim 16, wherein the bottom diffusion blocking layer has a trapezoidal cross-section.

19. The method of claim 16, wherein forming the patterned spacer layer comprises:

depositing a layer of spacer material over the top diffusion blocking layer; and etching the layer of spacer material until a portion of the top diffusion blocking layer is removed.

20. The method of claim 16, wherein the patterned spacer layer is in contact with the upper step of the stepped top surface of the top diffusion blocking layer and spaced apart from the lower step of the stepped top surface of the top diffusion blocking layer.

\* \* \* \* \*